(12) United States Patent
Fukunaga et al.

(10) Patent No.: US 11,015,242 B2
(45) Date of Patent: May 25, 2021

(54) HARD COATING, HARD-COATED TOOL, AND THEIR PRODUCTION METHODS

(71) Applicant: Mitsubishi Hitachi Tool Engineering, Ltd., Tokyo (JP)

(72) Inventors: Yuuzoh Fukunaga, Narita (JP); Masayuki Imai, Narita (JP)

(73) Assignee: Moldino Tool Engineering, Ltd., Tokyo (JP)

( * ) Notice: Subject to any disclaimer, the term of this patent is extended or adjusted under 35 U.S.C. 154(b) by 185 days.

(21) Appl. No.: 16/310,586

(22) PCT Filed: Jun. 30, 2017

(86) PCT No.: PCT/JP2017/024186
§ 371 (c)(1),
(2) Date: Dec. 17, 2018

(87) PCT Pub. No.: WO2018/008554
PCT Pub. Date: Jan. 11, 2018

(65) Prior Publication Data
US 2019/0177839 A1   Jun. 13, 2019

(30) Foreign Application Priority Data
Jul. 7, 2016 (JP) .............................. JP2016-134984

(51) Int. Cl.
*B23B 27/14* (2006.01)
*C23C 16/34* (2006.01)
(Continued)

(52) U.S. Cl.
CPC ............. *C23C 16/34* (2013.01); *B23B 27/14* (2013.01); *B23B 27/148* (2013.01); *B23C 5/16* (2013.01);
(Continued)

(58) Field of Classification Search
CPC ..... B23B 27/14; B23B 2224/24; C23C 16/34; C23C 16/455; C23C 16/45563
(Continued)

(56) References Cited

U.S. PATENT DOCUMENTS

| 5,981,049 A | 11/1999 | Ohara et al. |
| 2007/0218313 A1 | 9/2007 | Okada et al. |

(Continued)

FOREIGN PATENT DOCUMENTS

| JP | 10-237628 A | 9/1998 |
| JP | 2002-273607 A | 9/2002 |

(Continued)

OTHER PUBLICATIONS

International Search Report dated Oct. 3, 2017, issued for PCT/JP2017/024186.

*Primary Examiner* — Archene A Turner
(74) *Attorney, Agent, or Firm* — Locke Lord LLP; James E. Armstrong, IV; Nicholas J. DiCeglie, Jr.

(57) ABSTRACT

A hard coating comprising a lower layer formed by an fcc-based titanium aluminum nitride coating, and an upper layer formed by an aluminum nitride coating having an hcp crystal system, the upper layer having a columnar crystal structure, the columnar crystals having an average transverse cross section diameter of 0.05-0.6 μm, and a ratio of an X-ray diffraction peak value Ia(002) of (002) planes to an X-ray diffraction peak value Ia(100) of (100) planes in the upper layer meeting the relation of Ia(002)/Ia(100)≥6.

14 Claims, 11 Drawing Sheets

(51) Int. Cl.
*B23C 5/16* (2006.01)
*C23C 16/455* (2006.01)

(52) U.S. Cl.
CPC ...... *C23C 16/455* (2013.01); *C23C 16/45563* (2013.01); *B23B 2224/24* (2013.01)

(58) Field of Classification Search
USPC ....... 428/697, 698, 699; 427/255.23, 255.28, 427/255.39, 255.394, 255.395
See application file for complete search history.

(56) References Cited

U.S. PATENT DOCUMENTS

| | | | |
|---|---|---|---|
| 2009/0123779 A1 | 5/2009 | Endler | |
| 2012/0103260 A1 | 5/2012 | Park et al. | |
| 2015/0345013 A1* | 12/2015 | Paseuth | C23C 16/56 427/255.394 |
| 2016/0053372 A1* | 2/2016 | Stiens | C23C 16/34 428/336 |
| 2016/0333478 A1 | 11/2016 | Tatsuoka et al. | |
| 2017/0216930 A1 | 8/2017 | Sato et al. | |

FOREIGN PATENT DOCUMENTS

| | | |
|---|---|---|
| JP | 2005-297142 A | 10/2005 |
| JP | 2008-545063 A | 12/2008 |
| JP | 2012-533876 A | 12/2012 |
| JP | 2015-124407 A | 7/2015 |
| JP | 2016-003369 A | 1/2016 |
| JP | 2016-068252 A | 5/2016 |
| JP | 2016-117934 A | 6/2016 |
| JP | 2017104950 * | 6/2017 |

* cited by examiner

AlN, TiN (cubic, Fm3m)
[110] Injection

AlN (hexagonal, P6₃mc)
[010] Injection

HARD COATING, HARD-COATED TOOL, AND THEIR PRODUCTION METHODS

FIELD OF THE INVENTION

The present invention relates to a hard coating having excellent chipping resistance and coating adhesion, a hard-coated tool, and their production methods.

BACKGROUND OF THE INVENTION

Cutting tools having single- or multi-layered hard coatings of TiAlN, TiC, TiN, Ti(CN), $Al_2O_3$, etc. have been conventionally used to cut heat-resistant alloy steel, stainless steel, etc. The use conditions of such hard-coated tools have become increasingly severer; for example, in the case of wet-cutting stainless steel, the fusion of work components to cutting edges and the peeling of fused components occur during a cutting operation. The repetition of such fusion and peeling causes the peeling and chipping of hard coatings, resulting in short tool lives. To solve such problems, it is desired to provide a hard coating having excellent chipping resistance and coating adhesion, and a hard-coated member, such as a cutting tool, a die, etc., having such a hard coating.

JP 2002-273607 A discloses a coated cutting tool having an aluminum nitride coating, which is formed on a surface of a WC-based cemented carbide substrate by a thermal CVD method at a temperature of 700-980° C., using an $AlCl_3$ gas and an $NH_3$ gas as starting material gases. However, the aluminum nitride coating of the coated cutting tool of JP 2002-273607 A is formed by introducing a single-composition starting material gas obtained by mixing an $AlCl_3$ gas, an $NH_3$ gas, an $N_2$ gas and an $H_2$ gas in advance into a CVD furnace. Because an $AlCl_3$ gas and an $NH_3$ gas in the starting material gas are extremely reactive, their reaction proceeds before reaching works, forming an aluminum nitride coating having a coarse crystal grain structure, in which a ratio $Ia(002)/Ia(100)$ of the X-ray diffraction peak value $Ia(002)$ of (002) planes to the X-ray diffraction peak value $Ia(100)$ of (100) planes is about 3. It has thus been found that a hard coating having the aluminum nitride coating of JP 2002-273607 A has low chipping resistance and coating adhesion, suffering a short life.

JP 2005-297142 A discloses a hard-coated tool having an aluminum nitride or aluminum carbonitride coating formed by a thermal CVD method as an outermost layer. However, the aluminum nitride coating of the hard-coated tool of JP 2005-297142 A has a granular crystal structure, because it is formed by supplying a single-composition starting material gas indispensably containing an HCl gas into a CVD furnace. It has thus been found that a hard coating having such aluminum nitride coating has low chipping resistance and coating adhesion, suffering a short life.

OBJECT OF THE INVENTION

Accordingly, the object of the present invention is to provide a long-life hard coating having excellent chipping resistance and coating adhesion, a hard-coated tool, and their production methods.

DISCLOSURE OF THE INVENTION

The hard coating of the present invention comprises a lower layer formed by an fcc-based titanium aluminum nitride coating and an upper layer formed by an aluminum nitride coating having an hcp crystal system; the upper layer having an columnar crystal structure; the columnar crystals having an average transverse cross section diameter of 0.05-0.6 μm; and a ratio of an X-ray diffraction peak value $Ia(002)$ of (002) planes to an X-ray diffraction peak value $Ia(100)$ of (100) planes in the upper layer meeting the relation of $Ia(002)/Ia(100) \geq 6$.

In the hard coating of the present invention, a ratio of a merged X-ray diffraction peak value $It(111)Ia(101)$ of the (111) planes of the lower layer and the (101) planes of the upper layer to the $Ia(100)$ preferably meets the relation of $It(111)Ia(101)/Ia(100) \geq 1.5$, in an X-ray diffraction angle 2θ range of 36° to 39°. Such structure further improves the interlayer adhesion of the hard coating.

In the hard coating of the present invention, a ratio of the X-ray diffraction peak value $It(111)Ia(101)$ to the X-ray diffraction peak value $It(200)$ of the (200) planes of the lower layer preferably meets the relation of $It(111)Ia(101)/It(200) \geq 1.5$. Such structure further improves the interlayer adhesion of the hard coating.

In the hard coating of the present invention, 30% or more of lattice fringes are preferably continuous in an interface between the lower layer and the upper layer. Such structure further improves the interlayer adhesion of the hard coating.

The hard-coated tool of the present invention comprises the above hard coating formed on a substrate. The above hard coating has excellent chipping resistance and coating adhesion, providing the tool with a long life.

The method of the present invention for producing the above hard coating by a chemical vapor deposition method comprises (1) using a mixture gas $A_1$ comprising a $TiCl_4$ gas, an $AlCl_3$ gas, an $N_2$ gas and an $H_2$ gas, and a mixture gas $B_1$ comprising an $N_2$ gas, an $NH_3$ gas and an $H_2$ gas, as a first starting material gas for forming the lower layer; and (2) using a mixture gas $A_2$ comprising an $AlCl_3$ gas, an $N_2$ gas and an $H_2$ gas, and a mixture gas $B_2$ comprising an $NH_3$ gas, an $N_2$ gas and an $H_2$ gas, as a second starting material gas for forming the upper layer.

The method of the present invention for producing the above hard coating by a chemical vapor deposition method comprises (1) supplying a first starting material gas composed of a mixture gas $A_1$ comprising a $TiCl_4$ gas, an $AlCl_3$ gas, an $N_2$ gas and an $H_2$ gas, and a mixture gas $B_1$ comprising an $N_2$ gas, an $NH_3$ gas and an $H_2$ gas into a chemical vapor deposition apparatus containing substrates to form the lower layer, and then (2) supplying a second starting material gas composed of a mixture gas $A_2$ comprising an $AlCl_3$ gas, an $N_2$ gas and an $H_2$ gas, and a mixture gas $B_2$ comprising an $NH_3$ gas, an $N_2$ gas and an $H_2$ gas into the chemical vapor deposition apparatus.

It is preferable that the first starting material gas is composed of a mixture gas $A_1$ having a composition comprising 0.02-0.31% by volume of a $TiCl_4$ gas, 0.15-0.8% by volume of an $AlCl_3$ gas, and 3-40% by volume of an $N_2$ gas, the balance being an $H_2$ gas, and a mixture gas $B_1$ having a composition comprising 0.4-1.9% by volume of an $NH_3$ gas, and 2-26% by volume of an $N_2$ gas, the balance being an $H_2$ gas, with the total amount of the $TiCl_4$ gas, the $AlCl_3$ gas, the $NH_3$ gas, the $N_2$ gas and the $H_2$ gas as 100% by volume, a volume ratio $H_2(A_1)/H_2(B_1)$ of an $H_2$ gas in the mixture gas $A_1$ to an $H_2$ gas in the mixture gas $B_1$ being 1-5; and the second starting material gas is composed of a mixture gas $A_2$ having a composition comprising 0.5-1.4% by volume of an $AlCl_3$ gas, and 10.6-30.6% by volume of an $N_2$ gas, the balance being an $H_2$ gas, and a mixture gas $B_2$ having a composition comprising 0.6-0.95% by volume of an $NH_3$ gas, and 10.6-30.6% by volume of an $N_2$ gas, the balance being an $H_2$ gas, with the total amount of the $AlCl_3$ gas, the NH$_3$ gas, the N$_2$ gas and the H$_2$ gas as 100% by volume, a volume ratio H$_2$ (A$_2$)/H$_2$ (B$_2$) of an H$_2$ gas in the mixture gas A$_2$ to an H$_2$ gas in the mixture gas B$_2$ being 0.3-3.

In the method of the present invention, a chemical vapor deposition apparatus comprising first and second pipes rotating around a rotation axis O is used;

the first pipe has first nozzles, and the second pipe has second nozzles;

the distance H$_1$ between the openings of the first nozzles and the rotation axis O is larger than the distance H$_2$ between the openings of the second nozzles and the rotation axis O; and the mixture gases A$_1$, A$_2$ may be successively ejected from the first nozzles, and the mixture gases B$_1$, B$_2$ may be successively ejected from the second nozzles; or the mixture gases B$_1$, B$_2$ may be successively ejected from the first nozzles, and the mixture gases A$_1$, A$_2$ may be successively ejected from the second nozzles.

A ratio (H$_1$/H$_2$) of the distance H$_1$ to the distance H$_2$ is preferably in a range of 1.5-3.

It is preferable that a forming pressure of 3-6 kPa and a forming temperature of 750-900° C. are used to form the lower layer, and that a forming pressure of 3-5 kPa and a forming temperature of 750-850° C. are used to form the upper layer.

Effects of the Invention

Because the hard coating of the present invention comprises a lower layer formed by an fcc-based titanium aluminum nitride coating, and an upper layer formed by an aluminum nitride coating having an hcp crystal system, the upper layer having a columnar crystal structure, the columnar crystals having an average transverse cross section diameter of 0.05-0.6 µm, and a ratio of an X-ray diffraction peak value Ia(002) of (002) planes to an X-ray diffraction peak value Ia(100) of (100) planes in the upper layer meeting the relation of Ia(002)/Ia(100)≥6, for example, a cutting operation using a tool having such a hard coating causes less chipping and peeling of the hard coating due to the sticking of a work, thereby exhibiting remarkable chipping resistance and coating adhesion.

DESCRIPTION OF THE PREFERRED EMBODIMENTS

[1] Hard-Coated Tool

Figure 1A:
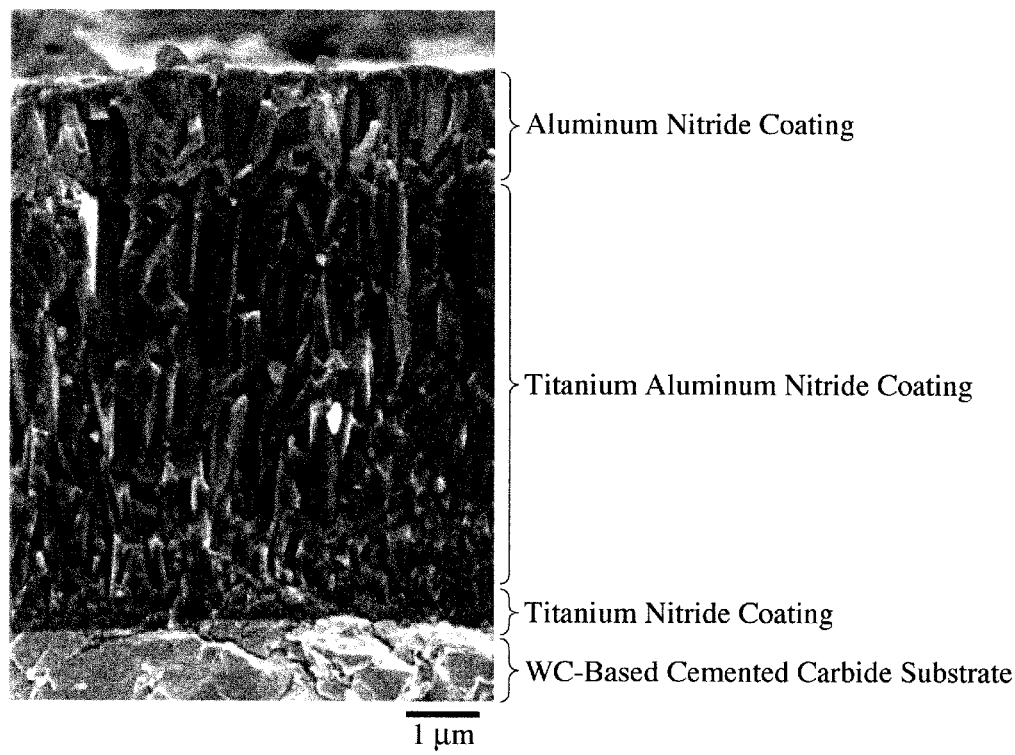
FIG. 1(a) is a scanning electron photomicrograph (SEM photograph) (magnification: 10,000 times) showing a cross section of the hard-coated tool of Example 1.

The hard-coated tool of the present invention comprises a hard coating having a lower layer formed by an fcc-based titanium aluminum nitride coating and an upper layer formed by an aluminum nitride coating having an hcp crystal system, which is formed on a substrate; the upper layer having a columnar crystal structure; the columnar crystals having an average transverse cross section diameter of 0.05-0.6 µm; and a ratio of an X-ray diffraction peak value Ia(002) of (002) planes to an X-ray diffraction peak value Ia(100) of (100) planes in the upper layer meeting the relation of Ia(002)/Ia(100)≥6.

(A) Substrate

The substrate should be a material having high heat resistance, to which chemical vapor deposition can be applied, for example, WC-based cemented carbide, cermet, high-speed steel, tool steel, ceramics such as sintered boron nitride based on cubic boron nitride (cBN) and sialon, etc. From the aspect of strength, hardness, wear resistance, toughness and thermal stability, WC-based cemented carbide, cermets, cBN and ceramics are preferable. Though the hard coating of the present invention may be formed on as-sintered surfaces (unworked surfaces) of substrates, it is preferably formed on worked surfaces (ground surface, cutting edge surface, etc.) to increase dimension precision.

(B) Hard Coating
(1) Lower Layer: Titanium Aluminum Nitride Coating
(a) Composition The titanium aluminum nitride coating as a lower layer indispensably contains Ti, Al and N. The composition of indispensable components in the titanium aluminum nitride coating preferably comprises 4-22 atomic % of Ti, 48-23 atomic % of Al, and 48-55 atomic % of N, with the total amount of Ti, Al and N as 100 atomic %. Within the above composition, the lower layer has good adhesion to the aluminum nitride coating (upper layer) having an hcp crystal system. The composition of indispensable components more preferably comprises 8-18 atomic % of Ti, 42-29 atomic % of Al, and 50-53 atomic % of N. 30 atomic % or less of N may be substituted by C or B. Though the titanium aluminum nitride coating may contain Cl as an inevitable impurity, the Cl content is preferably 1.5 atomic % or less, more preferably 0.8 atomic % or less. The composition of the titanium aluminum nitride coating can be measured by EPMA.

(b) Crystal System

The lower layer formed by a titanium aluminum nitride coating has an fcc-based crystal system. The term "fcc-based" means that in the X-ray diffraction of the titanium aluminum nitride coating, diffraction planes of an fcc crystal system have the highest diffraction peak, though other systems (hcp, etc.) may exist as sub-systems. With the fcc-based crystal system, the lower layer has good adhesion to the aluminum nitride coating (upper layer) having an hcp crystal system, providing a cutting tool, etc. with a long life. For higher performance, the lower layer formed by a titanium aluminum nitride coating preferably has a single system of fcc when analyzed by X-ray diffraction.

(c) Structure

Though the structure of the lower layer formed by a titanium aluminum nitride coating is not restricted but may be a granular crystal structure, it is preferably a columnar crystal structure. Among them, it is preferably a columnar crystal structure, in which high-Al-content TiAlN having an fcc crystal system is surrounded by network-shaped, high-Ti-content TiAlN having an fcc crystal system. With respect to a titanium aluminum nitride coating having a columnar crystal structure, in which high-Al-content TiAlN having an fcc crystal system is surrounded by network-shaped, high-Ti-content TiAlN having an fcc crystal system, further detailed explanations will be made below.

(i) High-Al-Content TiAlN Having Fcc Crystal System, and Network-Shaped, High-Ti-Content TiAlN Having Fcc Crystal System (i-1) Composition of High-Al-Content TiAlN The high-Al-content TiAlN has a composition represented by the general formula: $(Ti_{x_1}Al_{y_1})N$, wherein $x_1$ and $y_1$ are numbers meeting $x_1=0.005$ to 0.1, and $y_1=0.995$ to 0.9, respectively, by atomic ratio. When the ratio $x_1$ of Ti is less than 0.005, the Al content is too high, precipitating an hcp crystal system, and thus resulting in low hardness and poor high-temperature wear resistance. When $x_1$ is more than 0.1, the titanium aluminum nitride coating has a fine granular crystal structure with low oxidation resistance. For higher performance, the atomic ratio of $(Ti_{x_1}Al_{y_1})$ to N is preferably 0.3/0.7 to 0.7/0.3, more preferably 0.4/0.6 to 0.6/0.4.

(i-2) Composition of High-Ti-Content TiAlN

The high-Ti-content TiAlN has a composition represented by the general formula: $(Ti_{x_2}Al_{y_2})N$, wherein $x_2$ and $y_2$ are numbers meeting $x_2=0.5$ to 0.9, and $y_2=0.5$ to 0.1, respectively, by atomic ratio. When the ratio $x_2$ of Ti is less than 0.5, the Al content is too high, precipitating an hcp crystal system, and thus resulting in low hardness and wear resistance. When $x_2$ is more than 0.9, the Al content is too low, resulting in drastically decreased oxidation resistance. For higher performance, the atomic ratio of $(Ti_{x_2}Al_{y_2})$ to N is preferably 0.3/0.7 to 0.7/0.3, more preferably 0.4/0.6 to 0.6/0.4.

The compositions of the high-Al-content TiAlN and the high-Ti-content TiAlN can be determined by the measurement results of EDS described below.

(i-3) Structure

Figure 9A:
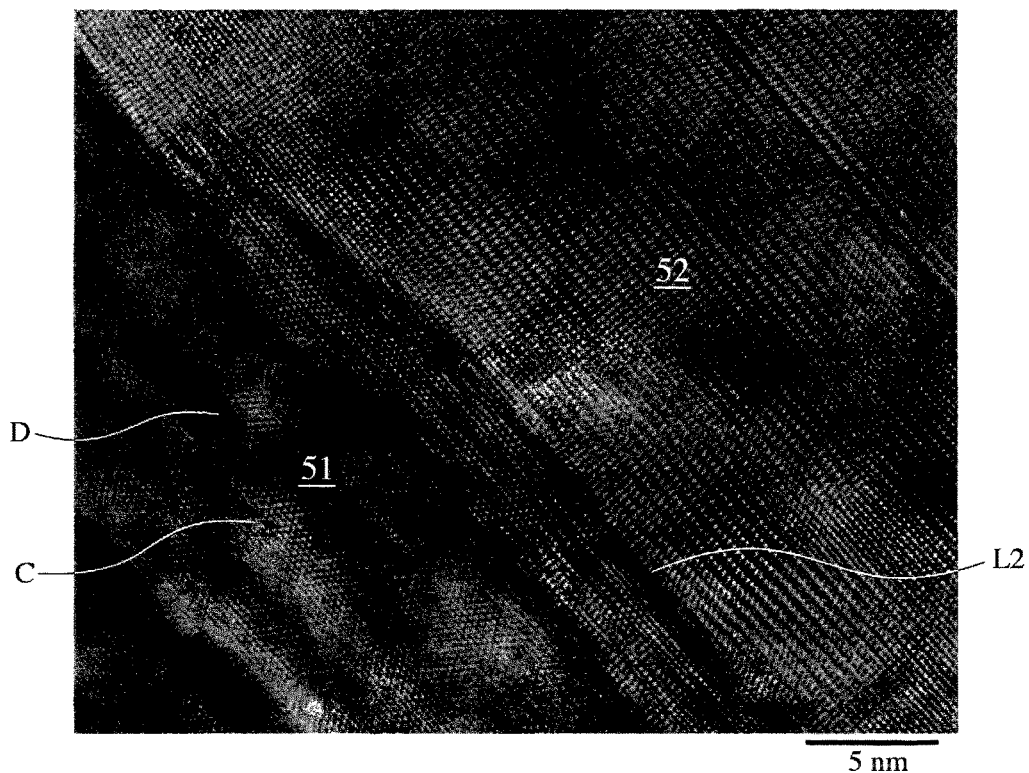
FIG. 9(a) is a TEM photograph (magnification: 4,000,000 times) enlargedly showing an area near the analysis points 1 to 4 in FIG. 4.

As is clear from FIG. 9(a), The high-Al-content TiAlN having an fcc crystal system (pale gray portions) C is surrounded by the network-shaped, high-Ti-content TiAlN having an fcc crystal system (dark gray or black portions) D. In FIG. 9(a), portions having small concentration differences between the high-Al-content TiAlN and the high-Ti-content TiAlN are observed. However, as long as at least 50% of the high-Al-content TiAlN is in contact with the surrounding high-Ti-content TiAlN, phase transformation from the fcc crystal system to the hcp crystal system is preferably suppressed in the hard coating of the present invention exposed to high temperatures during actual use, thereby exhibiting higher wear resistance and oxidation resistance than those of conventional TiAlN coatings. The sentence "high-Al-content TiAlN is surrounded by network-shaped, high-Ti-content TiAlN" means that at least 50% of the high-Al-content TiAlN is in contact with the surrounding network-shaped, high-Ti-content TiAlN. It is further preferable that at least 60% of the high-Al-content TiAlN is in contact with the surrounding network-shaped, high-Ti-content TiAlN. The term "network-shaped" means that the high-Ti-content TiAlN is distributed in a network shape when observed on a photomicrograph.

(d) Thickness

The thickness of the lower layer formed by a titanium aluminum nitride coating is preferably 2-15 μm, further preferably 3-10 μm. The thickness of less than 2 μm fails to provide sufficient coating effects, and the thickness of more than 15 μm makes the coating too thick, so that cracking likely occurs in the coating. The thickness of the titanium aluminum nitride coating can be properly controlled by coating time. Because the coating is not completely flat, what is simply called "thickness" means "average thickness."

(2) Upper Layer: Aluminum Nitride Coating
(a) Composition

The upper layer formed by an aluminum nitride coating contains Al and N as indispensable components. The composition of the indispensable components in the aluminum nitride coating preferably comprises 45-54 atomic % of Al, and 55-46 atomic % of N, with the total amount of Al and N as 100 atomic %. Within the above composition range, the upper layer has good adhesion to the lower layer formed by the titanium aluminum nitride coating having an fcc crystal system. The composition of the indispensable components more preferably comprises 46-53 atomic % of Al, and 54-47 atomic % of N. 30 atomic % or less of N may be substituted by C or B. Though the aluminum nitride coating may contain Cl as an inevitable impurity, the Cl content is preferably 0.5 atomic % or less, more preferably 0.2 atomic % or less. The composition of the aluminum nitride coating can be measured by EPMA.

(b) Crystal System

The upper layer formed by the aluminum nitride coating has an hcp crystal system. The term "hcp crystal system" means that only diffraction peaks of diffraction planes of aluminum nitride having an hcp crystal system are observed in X-ray diffraction. The aluminum nitride coating having an hcp crystal system has excellent lubrication, and high sticking resistance to work components. If the aluminum nitride coating did not have an hcp crystal system, work components would stick to tool cutting edges, or stuck components would peel from them, for example, during a cutting operation. With such sticking and peeling repeated, the hard coating is peeled and chipped, resulting in a short tool life.

(c) Structure

As shown in FIGS. 1(*a*) and 1(*b*), the aluminum nitride coating as the upper layer has a columnar crystal structure grown in a thickness direction. The average transverse cross section diameter of columnar crystals is 0.05-0.6 μm. If the aluminum nitride coating did not have a columnar crystal structure, the hard coating would likely be cracked, resulting in low chipping resistance, for example, during a cutting operation at high temperatures. When the average transverse cross section diameter is less than 0.05 μm, the percentage of crystal grain boundaries is excessively high. When a cutting operation is conducted with a cutting tool having such aluminum nitride coating, crystal grain boundaries act as paths for intruding oxygen in tool edge portions at high temperatures, extremely accelerating oxidation to cause cracking in the hard coating and drastically reduce chipping resistance. When the average transverse cross section diameter is more than 0.6 μm, cracking likely occurs in crystal grains, resulting in low chipping resistance. The lower limit of the average transverse cross section diameter of columnar crystals is preferably 0.1 μm. The upper limit of the average transverse cross section diameter of columnar crystals is preferably 0.5 μm, further preferably 0.45 μm.

The "average transverse cross section diameter" of columnar crystals in the aluminum nitride coating is an average diameter of columnar crystals in the columnar crystal structure of the aluminum nitride coating grown in a thickness direction, which is observed in a cross section perpendicular to the substrate surface. Specifically, the "average transverse cross section diameter" was determined by measuring the width of each columnar crystal grain grown in a thickness direction, which crosses a straight line L1 drawn at a middle position of the columnar crystal structure of the aluminum nitride coating in the SEM photograph of FIG. 1(*b*), and arithmetically averaging the measured values.

(d) Thickness

The thickness of the aluminum nitride coating is preferably 0.2-10 μm, more preferably 0.5-4 μm. When the thickness is less than 0.2 μm, sufficient coating effects cannot be obtained. When the thickness exceeds 10 μm, the coating is too thick, likely suffering cracking. The thickness of the aluminum nitride coating can be properly controlled by coating time.

(e) X-Ray Diffraction Peak Value

A ratio of an X-ray diffraction peak value Ia(002) of (002) planes to an X-ray diffraction peak value Ia(100) of (100) planes in the aluminum nitride coating as the upper layer meets the relation of Ia(002)/Ia(100)≥6. When Ia(002) is 6 times Ia(100) or more, the crystal structure of the aluminum nitride coating is strongly oriented in the (002) planes, resulting a polycrystal having columnar crystal grains grown in a C-axis direction and having a small average transverse cross section diameter. Accordingly, a hard-coated member (cutting tool, die, etc.) having the aluminum nitride coating of the present invention has excellent chipping resistance with longer life than those of conventional ones. The identification of the crystal structure and the measurement of X-ray diffraction peak values in the aluminum nitride coating were conducted by an X-ray diffraction apparatus under the later-described X-ray diffraction conditions. The ratio of Ia(002) to Ia(100) meets the relation of preferably Ia(002)/Ia(100)=6 to 80, further preferably Ia(002)/Ia(100)=13 to 70.

(f) Relation with Lower Layer (i) Interface Structure Between Lower Layer and Upper Layer 30% or more of lattice fringes are preferably continuous in an interface between the lower layer and the upper layer. The lattice fringes are in a stripe pattern seen in a polycrystal when observed by high-magnification TEM. Only when both crystals in adjacent layers are oriented in parallel with incident beams of TEM, lattice image of both crystals is simultaneously observed. Continuous lattice fringes between the lower layer and the upper layer means that the upper layer has epitaxially grown on the lower layer. The lattice fringes are regarded as continuous in the present invention, when 30% or more of lattice fringes are continuous in an interface between the lower layer and the upper layer.

Figure 5:
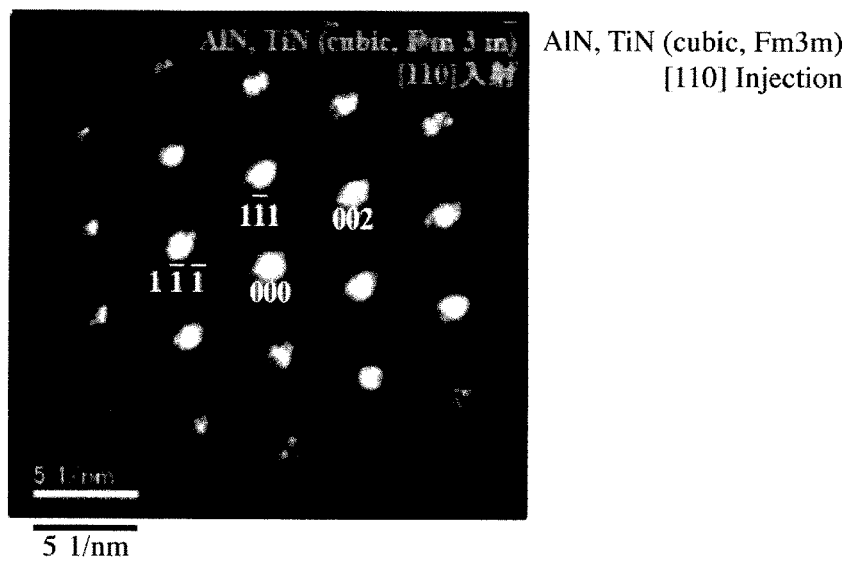
FIG. 5 is a view showing the nanobeam diffraction (NAD) of the titanium aluminum nitride coating of Example 1 at an analysis point 1 in FIG. 4.
Figure 6:
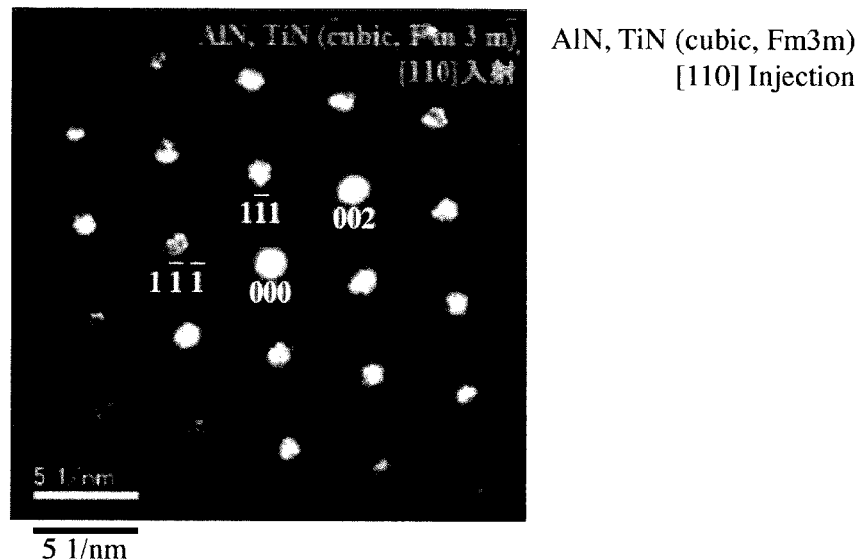
FIG. 6 is a view showing the nanobeam diffraction (NAD) of the titanium aluminum nitride coating of Example 1 at an analysis point 2 in FIG. 4.
Figure 7:
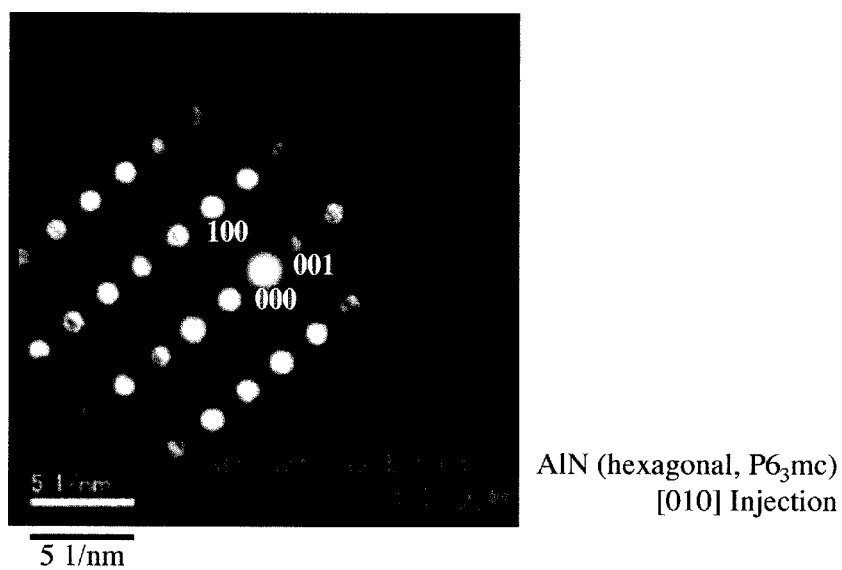
FIG. 7 is a view showing the nanobeam diffraction (NAD) of the aluminum nitride coating of Example 1 at an analysis point 3 in FIG. 4.
Figure 8:
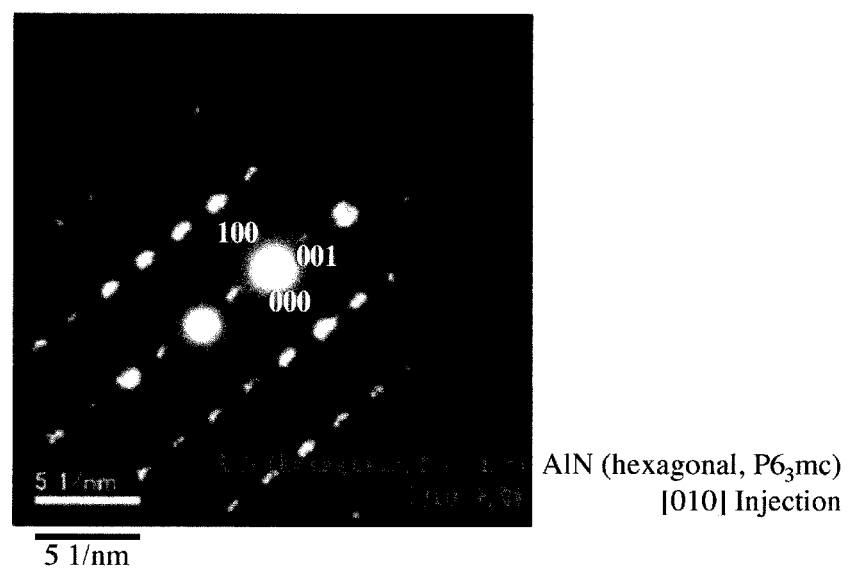
FIG. 8 is a view showing the nanobeam diffraction (NAD) of the aluminum nitride coating of Example 1 at an analysis point 4 in FIG. 4.

In general, lattice fringes are not continuous in interface between the titanium aluminum nitride coating and the aluminum nitride coating, because of different crystal structures, failing to obtain sufficient adhesion. However, in the present invention, the lower layer is a titanium aluminum nitride coating at least based on an fcc crystal system as shown in FIGS. 5 and 6. The upper layer is an aluminum nitride coating having hcp columnar crystals having an average transverse cross section diameter of 0.05-0.6 μm as shown in FIGS. 7 and 8. Though the mechanism of increasing adhesion between the lower layer and the upper layer is not fully analyzed, it may be presumed that the formation of an aluminum nitride coating having hcp columnar crystals having as small an average transverse cross section diameter as 0.05-0.6 μm on an fcc-based titanium aluminum nitride coating provides lattice fringes, 30% or more of which are continuous between the titanium aluminum nitride lower layer and the aluminum nitride upper layer as shown in FIG. 9(*a*), resulting in high adhesion. The upper layer formed by such aluminum nitride coating having an hcp crystal system has high sticking resistance with good adhesion to the lower layer, providing the hard coating with a longer life, which provides excellent tool lives to cutting tools.

It is observed that in the hard coating of the present invention, a higher continuity ratio of lattice fringes in an interface between the lower layer and the upper layer tends to provide higher peeling resistance. Accordingly, to obtain a high coating performance, lattice fringes in an interface between the lower layer and the upper layer are continuous further preferably 50% or more, particularly 70% or more.

(ii) X-Ray Diffraction Peak Values of Lower and Upper Layers

A ratio of It(111)Ia(101) to Ia(100), wherein It(111)Ia(101) and Ia(100) respectively represent a merged X-ray diffraction peak value of the (111) planes of the lower layer and the (101) planes of the upper layer, and an X-ray diffraction peak value of the (100) planes of the upper layer, in an X-ray diffraction angle 2θ range of 36-39°, preferably meets the relation of It(111)Ia(101)/Ia(100)≥1.5. By meeting the relation of It(111)Ia(101)/Ia(100)≥1.5, the (101) planes of the upper layer has sufficient high intensity. The (111) planes of the titanium aluminum nitride coating having an fcc crystal system and the (101) planes of the aluminum nitride coating having an hcp crystal system have close lattice constants, with their X-ray diffraction peaks overlapping in a diffraction angle 2θ range of 36-39°. Accordingly, a high merged X-ray diffraction peak value It(111)Ia(101) of the (111) planes of the lower layer and the (101) planes of the upper layer provides high continuity of lattice fringes between the (111) planes of the lower layer and the (101) planes of the upper layer, thereby obtaining high adhesion. The ratio of It(111)Ia(101) to Ia(100) meets further preferably It(111)Ia(101)/Ia(100)=1.5 to 40, particularly It(111)Ia(101)/Ia(100)=10.5 to 30.

A ratio of the above merged X-ray diffraction peak value It(111)Ia(101) to an X-ray diffraction peak value It(200) of the (200) planes of the lower layer preferably meets the relation of It(111)Ia(101)/It(200)≥1.5. When the merged X-ray diffraction peak value It(111)Ia(101) is as high as 1.5 times or more the X-ray diffraction peak value of the (200) planes of the lower layer, the lower layer is oriented in the (111) planes, with high lattice fringe continuity with the (101) planes of the upper layer, and thus high adhesion. The ratio of It(111)Ia(101) to It(200) meets further preferably It(111)Ia(101)/It(200)=1.5 to 40, particularly It(111)Ia(101)/It(200)=4 to 30.

(3) Primer Layer

A primer layer formed by a chemical vapor deposition method between the substrate and the lower layer for a longer life is preferably a TiN coating, a Ti(CN) coating or a TiZr(CN) coating, further preferably a TiN coating, though not particularly restrictive. The primer layer is preferably as thick as about 0.05-0.1 μm.

(4) Further Upper Layer

Though not particularly restrictive, a single- or multi-layer hard coating indispensably comprising at least one element selected from the group consisting of Ti, Al, Cr, B and Zr, and at least one element selected from the group consisting of C, N and O may be formed by a chemical vapor deposition method as a further upper layer on the above upper layer. The further upper layer may be a single- or multi-layer (for example, 2-50 layers) coating of TiC, CrC, SiC, VC, ZrC, TiN, TiAlN, CrN, $Si_3N_4$, VN, ZrN, Ti(CN), (TiSi) N, (TiB)N, TiZrN, TiAl(CN), TiSi(CN), TiCr(CN), TiZr(CN), Ti(CNO), TiAl(CNO), Ti(CO), $TiB_2$, etc.

[2] Chemical Vapor Deposition Apparatus

Figure 14:
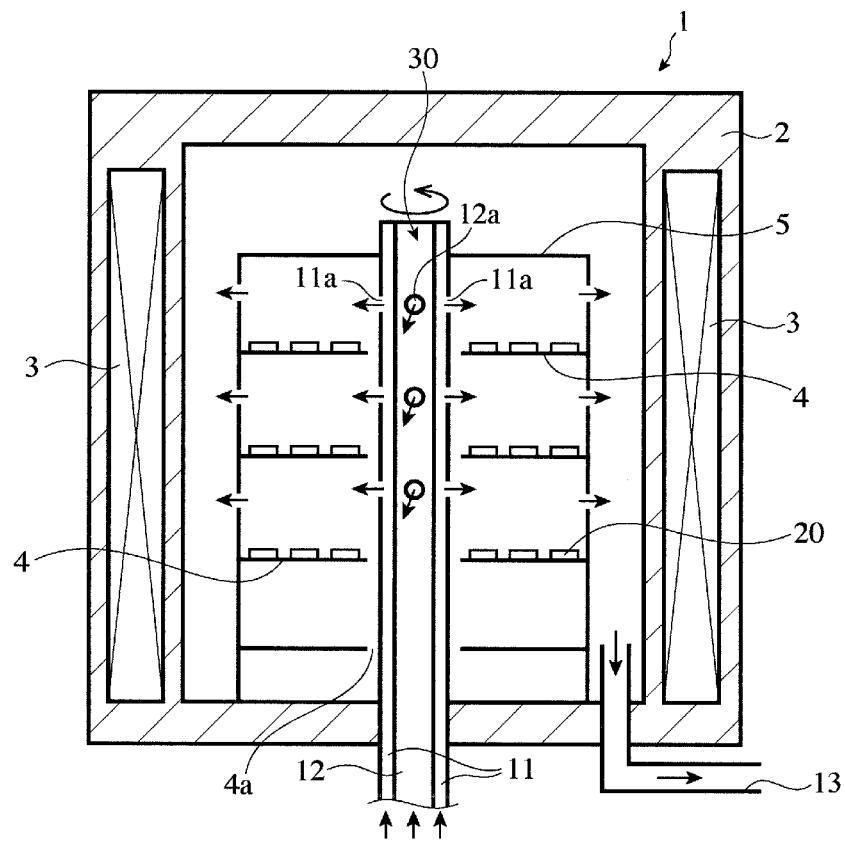
FIG. 14 is a schematic view showing an example of chemical vapor deposition apparatuses (CVD furnaces) for forming the hard coating of the present invention.

The lower and upper layers of the present invention, and the primer layer and the further upper layer can be formed by a chemical vapor deposition method using a chemical vapor deposition apparatus (CVD furnace) such as a thermal chemical vapor deposition apparatus or a plasma-enhanced chemical vapor deposition apparatus, etc. As shown in FIG. 14, the chemical vapor deposition apparatus (CVD furnace) 1 comprises a chamber 2, a heater 3 disposed in a wall of the chamber 2, pluralities of shelves (jigs) 4, 4 rotating in the chamber 2, a reaction vessel 5 covering shelves 4, 4, first and second pipes 11, 12 vertically penetrating center openings 4a of the shelves 4, 4, and pluralities of nozzles 11a, 11a, 12a, 12a attached to each pipe 11, 12. The shelves 4, 4, on which large numbers of insert substrates 20 are placed, are rotated in the chamber 2. The first pipe 11 and the second pipe 12 penetrate a bottom portion of the chamber 2 such that they can integrally rotate, and are rotatably connected to outside pipes (not shown). A pipe 13 for discharging a carrier gas and an unreacted gas penetrates the bottom portion of the chamber 2.

[3] Production Method

Taking for example a case where a thermal chemical vapor deposition method is used, the formation of the lower and upper layers of the present invention, and the primer layer and the further upper layer will be explained in detail below, but it should be of course noted that the present invention is not restricted thereto, but other chemical vapor deposition methods may be used.

(A) Formation of Primer Layer

When a TiN coating is used as a primer layer, an $H_2$ gas, an $N_2$ gas and/or an Ar gas are introduced into a CVD furnace containing substrates, whose temperature is elevated to a coating temperature, and a starting material gas comprising a $TiCl_4$ gas, an $N_2$ gas and an $H_2$ gas is then introduced into the CVD furnace to form a TiN coating as the primer layer.

When a Ti(CN) coating is used as a primer layer, an $H_2$ gas, an $N_2$ gas and/or an Ar gas are introduced into a CVD furnace containing substrates, whose temperature is elevated to a coating temperature, and a starting material gas comprising a $TiCl_4$ gas, a $CH_4$ gas, an $N_2$ gas and an $H_2$ gas, or a $TiCl_4$ gas, a $CH_3CN$ gas, an $N_2$ gas and an $H_2$ gas is then introduced into the CVD furnace to form a Ti(CN) coating as the primer layer.

When a TiZr(CN) coating is used as a primer layer, an $H_2$ gas, an $N_2$ gas and/or an Ar gas are introduced into a CVD furnace containing substrates, whose temperature is elevated to a coating temperature, and a starting material gas comprising a $TiCl_4$ gas, a $CH_4$ gas, an $N_2$ gas, an $H_2$ gas and a $ZrCl_4$ gas, or a $TiCl_4$ gas, a $ZrCl_4$ gas, a $CH_3CN$ gas, an $N_2$ gas and an $H_2$ gas is then introduced into the CVD furnace to form a TiZr(CN) coating as the primer layer.

(B) Formation of Lower Layer (Titanium Aluminum Nitride Coating)

(1) First Starting Material Gas

To form an fcc-based titanium aluminum nitride coating, a first starting material gas comprising a mixture gas $A_1$ comprising a $TiCl_4$ gas, an $AlCl_3$ gas, an $N_2$ gas and an $H_2$ gas, and a mixture gas $B_1$ comprising an $NH_3$ gas, an $N_2$ gas and an $H_2$ gas is used. It is preferable that the composition of the mixture gas $A_1$ comprises 0.02-0.31% by volume of a $TiCl_4$ gas, 0.15-0.8% by volume of an $AlCl_3$ gas, and 3-40% by volume of an $N_2$ gas, the balance being an $H_2$ gas, and the composition of the mixture gas $B_1$ comprises 0.4-1.9% by volume of an $NH_3$ gas, and 2-26% by volume of an $N_2$ gas, the balance being an $H_2$ gas, with the total amount of the $TiCl_4$ gas, the $AlCl_3$ gas, the $NH_3$ gas, the $N_2$ gas and the $H_2$ gas as 100% by volume, a volume ratio $H_2$ $(A_1)/H_2$ $(B_1)$ of an $H_2$ gas in the mixture gas $A_1$ to an $H_2$ gas in the mixture gas $B_1$ being 1-5. In the mixture gases $A_1$, $B_1$, part of the $H_2$ gas, a carrier gas, may be substituted by an Ar gas.

It is more preferable that the composition of the mixture gas $A_1$ comprises 0.02-0.31% by volume of a $TiCl_4$ gas, 0.15-0.8% by volume of an $AlCl_3$ gas, and 4.9-21.8% by volume of an $N_2$ gas, the balance being an $H_2$ gas, and the composition of the mixture gas $B_1$ comprises 0.7-1.9% by volume of an $NH_3$ gas, and 3-16.5% by volume of an $N_2$ gas, the balance being an $H_2$ gas, the volume ratio $H_2$ $(A_1)/H_2$ $(B_1)$ being 1.0-4.8.

It is further preferable that the composition of the mixture gas $A_1$ comprises 0.1-0.2% by volume of a $TiCl_4$ gas, 0.3-0.5% by volume of an $AlCl_3$ gas, and 4.9-21.8% by volume of an $N_2$ gas, the balance being an $H_2$ gas, and the composition of the mixture gas $B_1$ comprises 0.8-1.3% by volume of an $NH_3$ gas, and 3-16.5% by volume of an $N_2$ gas, the balance being an $H_2$ gas, the volume ratio $H_2$ $(A_1)/H_2$ $(B_1)$ being 1.1-4.6.

(a) Mixture Gas $A_1$

When the $TiCl_4$ gas is in a range of 0.02-0.31% by volume, a titanium aluminum nitride coating obtained, for example, at a forming temperature of 750-830° C. by using the CVD furnace 1 of FIG. 14 described below exhibits excellent chipping resistance, having a columnar crystal structure, in which high-Al-content TiAlN having an fcc crystal system is surrounded by network-shaped, high-Ti-content TiAlN having an fcc crystal system. When the TiCl$_4$ gas is less than 0.02% by volume, the amount of Al is excessive in the mixture gas A$_1$, precipitating an hcp crystal system, thereby providing the titanium aluminum nitride coating with low hardness. On the other hand, when the TiCl$_4$ gas exceeds 0.31% by volume, the titanium aluminum nitride coating does not have the above columnar crystal structure.

When the AlCl$_3$ gas is in a range of 0.15-0.8% by volume, the titanium aluminum nitride coating contains a proper amount of Al, excellent in both oxidation resistance and wear resistance. When the AlCl$_3$ gas is less than 0.15% by volume, the titanium aluminum nitride coating contains too small an amount of Al, exhibiting low oxidation resistance. When the AlCl$_3$ gas exceeds 0.8% by volume, the titanium aluminum nitride coating contains too much Al, precipitating an hcp crystal system, thereby exhibiting low wear resistance.

When the N$_2$ gas is either less than 3% by volume or more than 40% by volume, the reaction speed of the first starting material gas changes, so that a titanium aluminum nitride coating formed on each substrate in the CVD furnace has a poor thickness distribution.

(b) Mixture Gas B$_1$

For example, when formed with an NH$_3$ gas in a range of 0.4-1.9% by volume in the mixture gas B$_1$, at a forming temperature of 750-830° C. in the CVD furnace 1 of FIG. 14 described below, a columnar crystal structure in which high-Al-content TiAlN having an fcc crystal system is surrounded by network-shaped, high-Ti-content TiAlN having an fcc crystal system is obtained. When the NH$_3$ gas is either less than 0.4% by volume or more than 1.9% by volume, the reaction speed changes, failing to obtain the above columnar crystal structure.

When the N$_2$ gas is either less than 2% by volume or more than 26% by volume, the reaction speed of the first starting material gas changes, so that a titanium aluminum nitride coating formed on each substrate in the CVD furnace has a poor thickness distribution.

(c) Mixture Gases A$_1$ and B$_1$

When the volume ratio H$_2$ (A)/H$_2$ (B$_1$) of an H$_2$ gas in the mixture gas A$_1$ to an H$_2$ gas in the mixture gas B$_1$ is either less than 1 or more than 5, the reaction speed of the first starting material gas changes, so that a titanium aluminum nitride coating formed on each substrate in the CVD furnace has a poor thickness distribution.

(2) Introduction Method of First Starting Material Gas

To control the reaction speed of the first starting material gas by mixing high-reactivity mixture gases A$_1$ and B$_1$, it is preferable to introduce the mixture gas A$_1$ and the mixture gas B$_1$ into the CVD furnace 1 without contact. By the introduction without contact of extremely highly reactive AlCl$_3$ gas and NH$_3$ gas in the first starting material gas, their reaction can be suppressed before reaching works, thereby preventing the crystal structure from becoming too coarse. To this end, as shown in FIGS. 14 and 15(*a*) to 15(*c*), for example, the mixture gases A$_1$ and B$_1$ are preferably separately ejected from nozzles 11*a* and 12*a* of the first and second pipes, which have different distances from the rotation axis, into the CVD furnace 1, like the introduction method of the second starting material gas described later.

(3) Forming Temperature

The temperature of forming the titanium aluminum nitride coating is preferably 750-900° C. When the forming temperature is lower than 750° C., the resultant titanium aluminum nitride coating has too large a chlorine content, resulting in low hardness. On the other hand, when the forming temperature exceeds 900° C., the reaction is too accelerated, making crystal grains coarser, and thus resulting in poor oxidation resistance. The temperature of forming the titanium aluminum nitride coating is further preferably 760-890° C. The forming temperature was determined by measuring the temperature of the furnace by a thermocouple (not shown) disposed near the reaction vessel 5 in the CVD furnace 1 shown in FIG. 14, during a coating operation.

For example, at a forming temperature of 750-830° C. using the CVD furnace 1 of FIG. 14 described later, a titanium aluminum nitride coating having a columnar crystal structure, in which high-Al-content TiAlN having an fcc crystal system is surrounded by network-shaped, high-Ti-content TiAlN having an fcc crystal system, is formed. When the forming temperature is higher than 830° C. and 900° C. or lower, a titanium aluminum nitride coating having a granular crystal structure is formed. To form the columnar crystal structure, in which high-Al-content TiAlN having an fcc crystal system is surrounded by network-shaped, high-Ti-content TiAlN having an fcc crystal system, the forming temperature is further preferably 760-820° C. To form a titanium aluminum nitride coating having a granular crystal structure, the forming temperature is further preferably 840-890° C.

(4) Forming Pressure

The pressure of forming the titanium aluminum nitride coating is preferably 3-6 kPa. When the forming pressure is less than 3 kPa, the resultant titanium aluminum nitride coating has an uneven composition. On the other hand, when the forming pressure exceeds 6 kPa, the resultant titanium aluminum nitride coating has coarse crystal grains, exhibiting poor oxidation resistance. The pressure of forming the titanium aluminum nitride coating is further preferably 3-5 kPa.

(C) Formation of Upper Layer (Aluminum Nitride Coating)

(1) Second Starting Material Gas

As a second starting material gas for forming the aluminum nitride coating, a mixture gas A$_2$ comprising an AlCl$_3$ gas, an N$_2$ gas and an H$_2$ gas, and a mixture gas B$_2$ comprising an NH$_3$ gas, an N$_2$ gas and an H$_2$ gas are used. It is preferable that the composition of the mixture gas A$_2$ comprises 0.5-1.4% by volume of an AlCl$_3$ gas, and 10.6-30.6% by volume of an N$_2$ gas, the balance being an H$_2$ gas, and the composition of the mixture gas B$_2$ comprises 0.6-0.95% by volume of an NH$_3$ gas, and 10.6-30.6% by volume of an N$_2$ gas, the balance being an H$_2$ gas, with the total amount of the AlCl$_3$ gas, the NH$_3$ gas, the N$_2$ gas and the H$_2$ gas as 100% by volume, a volume ratio H$_2$ (A$_2$)/H$_2$ (B$_2$) of an H$_2$ gas in the mixture gas A$_2$ to an H$_2$ gas in the mixture gas B$_2$ being 0.3-3. In the mixture gases A$_2$, B$_2$, part of the H$_2$ gas, a carrier gas, may be substituted by an Ar gas.

It is further preferable that the composition of the mixture gas A$_2$ comprises 0.6-1.3% by volume of an AlCl$_3$ gas, and 10.8-30.0% by volume of an N$_2$ gas, the balance being an H$_2$ gas, and the composition of the mixture gas B$_2$ comprises 0.7-0.95% by volume of an NH$_3$ gas, and 10.8-30.0% by volume of an N$_2$ gas, the balance being an H$_2$ gas, a volume ratio H$_2$ (A$_2$)/H$_2$ (B$_2$) of an H$_2$ gas in the mixture gas A$_2$ to an H$_2$ gas in the mixture gas B$_2$ being 0.3-3.0.

(a) Mixture Gas $A_2$

When the $AlCl_3$ gas is less than 0.5% by volume, the reaction speed is low. On the other hand, when the $AlCl_3$ gas exceeds 1.4% by volume, AlN crystal grains become coarser.

When the $N_2$ gas is either less than 10.6% by volume or more than 30.6% by volume, the reaction speed of the second starting material gas changes, providing an aluminum nitride coating formed on the lower layer with a poor thickness distribution.

(b) Mixture Gas $B_2$

When the $NH_3$ gas is either less than 0.6% by volume or more than 0.95% by volume, the reaction speed of the second starting material gas changes, failing to obtain a characteristic microstructure (columnar crystal structure) of the upper layer of the present invention.

When the $N_2$ gas is either less than 10.6% by volume or more than 30.6% by volume, the reaction speed of the second starting material gas changes, providing the aluminum nitride coating formed on the lower layer with a poor thickness distribution.

(c) Mixture Gases $A_2$ and $B_2$

When the volume ratio $H_2 (A_2)/H_2 (B_2)$ of an $H_2$ gas in the mixture gas $A_2$ to an $H_2$ gas in the mixture gas $B_2$ is either less than 0.3 or more than 3, the reaction speed of the second starting material gas changes, providing the aluminum nitride coating formed on the lower layer with a poor thickness distribution.

(2) Introduction Method of Second Starting Material Gas

To control the reaction speed of the second starting material gas by mixing high-reactivity mixture gases $A_2$ and $B_2$, the mixture gas $A_2$ and the mixture gas $B_2$ are preferably introduced into the CVD furnace 1 without contact. By introducing extremely highly reactive $AlCl_3$ gas and $NH_3$ gas in the second starting material gas without contact, their reaction before reaching works can be suppressed, thereby forming an aluminum nitride coating having a columnar crystal structure having an average transverse cross section diameter of 0.05-0.6 μm. When the $AlCl_3$ gas and the $NH_3$ gas are introduced into the CVD furnace in a mixed state, the resultant aluminum nitride coating has a granular structure, exhibiting low chipping resistance. Also, when the second starting material gas contains large amounts of $AlCl_3$ and/or $NH_3$, the reaction is excessively accelerated, resulting in an aluminum nitride coating having low orientation of (002) planes, which has low chipping resistance.

Figure 15A:
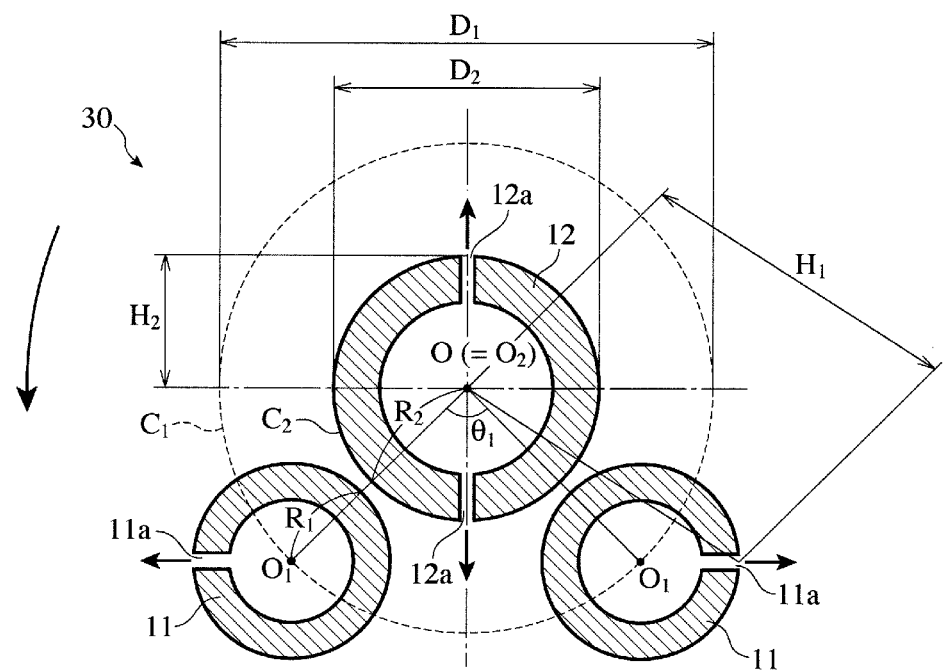
FIG. 15(a) is a transverse cross-sectional view showing an example of first pipe assemblies.

To introduce the mixture gas $A_2$ and the mixture gas $B_2$ without contact into the CVD furnace 1, for example, a CVD furnace 1 comprising a pipe assembly 30, to which totally three pipes 11, 11, 12 are fixed, as shown in FIGS. 14 and 15(a), is used.

The mixture gas $A_2$ and the mixture gas $B_2$ ejected from each nozzle should be introduced separately into the CVD furnace 1, without hindering their flow. To this end, as illustrated in FIGS. 15(a) to 15(c), one of the first and second nozzles 11a, 12a ejecting the mixture gases $A_2$, $B_2$ should be disposed on a center side, and the other should be disposed on a peripheral side, to eject the mixture gases $A_2$ and $B_2$ separately from the first and second nozzles 11a, 12a.

To obtain the above columnar crystal structure, the nozzles 11a, 12a ejecting the mixture gases $A_2$, $B_2$ are preferably rotated at a speed of 2-4 rpm. The rotation directions of the first and second nozzles 11a, 12a are not restrictive.

Figure 15B:
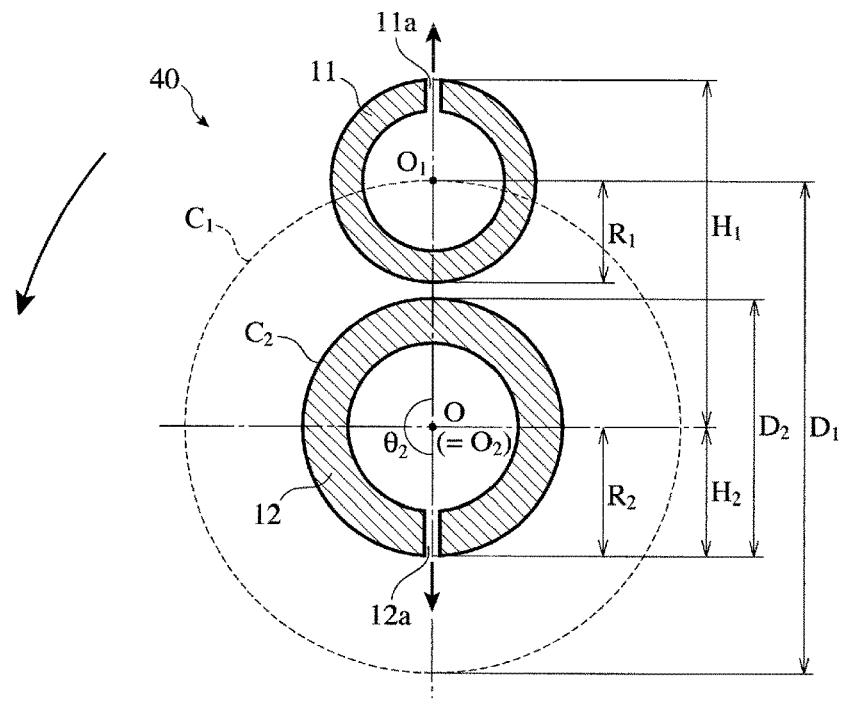
FIG. 15(b) is a transverse cross-sectional view showing an example of second pipe assemblies.
Figure 15C:
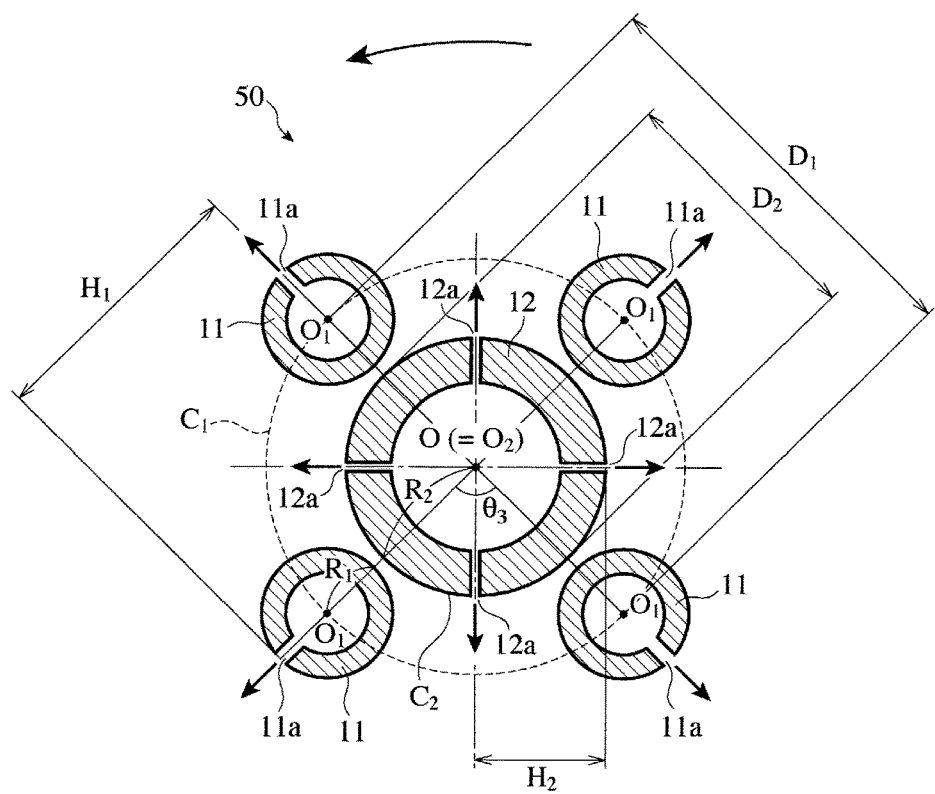
FIG. 15(c) is a transverse cross-sectional view showing an example of third pipe assemblies.

FIGS. 15(a) to 15(c) show preferred examples of nozzle structures for ejecting the mixture gases $A_2$, $B_2$. With respect to each rotation axis O of pipe assemblies 30, 40, 50, the first nozzles 11a are disposed on a peripheral side, and the second nozzles 12a are disposed on a center side. To obtain the above columnar crystal structure, the distance from a nozzle opening ejecting the mixture gas $B_2$ to a work is preferably smaller than the distance from a nozzle opening ejecting the mixture gas $A_2$ to a work. Because a $TiCl_4$ gas and an $AlCl_3$ gas in the mixture gas $A_2$ are extremely highly reactive with an $NH_3$ gas in the mixture gas $B_2$, they are rapidly reacted when introduced into the CVD furnace. With a high reaction speed, the reaction likely occurs before reaching works. If nozzle openings ejecting the mixture gases $A_2$ and $B_2$ were equally distant from the rotation axis ($H_1=H_2$), the mixture gases $A_2$ and $B_2$ are drastically reacted until reaching works, resulting in aluminum nitride coatings having coarse crystal grains, which exhibit low performance. Oppositely to the above, the distance between a nozzle opening for the mixture gas $A_2$ and a work may be smaller than the distance between a nozzle opening for the mixture gas $B_2$ and a work.

To obtain the above columnar crystal structure, a ratio $(H_1/H_2)$ of the distance $H_1$ between an opening of the first nozzle 11a and the rotation axis O to the distance $H_2$ between an opening of the second nozzle 12a and the rotation axis O is preferably in a range of 1.5-3.

(a) First Pipe Assembly

FIG. 15(a) shows an example of first pipe assemblies 30 for introducing the mixture gases $A_2$ and $B_2$ without contact into the CVD furnace 1. This pipe assembly 30 comprises two first pipes 11, 11 and one second pipe 12, both ends of the first and second pipes 11, 11, 12 being integrally fixed by holding members (not shown).

The first pipe 11 has a radius $R_1$, and the second pipe 12 has a radius $R_2$. A center axis $O_1$ of the first pipe 11 is positioned on a circle $C_1$ of a first diameter $D_1$ around the rotation axis O. Accordingly, two first pipes 11, 11 are equally distant from the rotation axis O. A center angle $\theta_1$ between the center axes $O_1$, $O_1$ of the first pipes 11, 11 with respect to the rotation axis O is preferably 90-180°. The center axis $O_2$ of the second pipe 12 is positioned at the rotation axis O, and an outer surface of the second pipe 12 is on a circle $C_2$ of a second diameter $D_2$ ($=2R_2$) around the rotation axis O.

The nozzles (first nozzles) 11a, 11a of the first pipes 11, 11 are oriented outward in just opposite directions (directions of 180°). Though each first pipe 11 has a vertical line of nozzles (first nozzles) 11a in the depicted example, it is not restrictive, and the first nozzles 11a may be arranged in plural lines. The second pipe 12 has two vertical lines of nozzles (second nozzles) 12a, 12a, which are diametrically oriented (directions of 180°). Of course, the second nozzles 12a are not limited to be in two lines, but may be in one line. Because the first diameter $D_1$ is larger than the second diameter $D_2$ [$D_1 \geq 2(R_1+R_2)$], the first nozzles 11a, 11a are on a peripheral side, and the second nozzles 12a, 12a are positioned inside, when the pipe assembly 30 is rotated around the rotation axis O.

When the second pipe 12 has a line of second nozzles 12a, and when the center angle $\theta_1$ of the center axes $O_1$, $O_1$ of the first pipes 11, 11 is less than 180°, the second nozzles 12a are preferably oriented in a distant direction from the first nozzles 11a, 11a (on the opposite side to the center angle $\theta_1$). In this case, the ejection direction of the first nozzles 11a is preferably perpendicular to the ejection direction of the second nozzles 12a.

When the center axes $O_1$, $O_1$ of the first pipes 11, 11 and the center axis $O_2$ of the second pipe 12 are on the same straight line, and when the second pipe 12 has two lines of second nozzles 12a, 12a, the first nozzles 11a, 11a are preferably oriented in just opposite directions (directions of 180°), and the second nozzles 12a are preferably oriented in a perpendicular direction to the first nozzles 11a, 11 a and oriented to each other in just opposite directions (a center angle of 90°).

(b) Second Pipe Assembly

FIG. 15(b) shows an example of second pipe assemblies 40 for introducing the mixture gas $A_2$ and the mixture gas $B_2$ without contact into the CVD furnace 1. This pipe assembly 40 comprises one first pipe 11 and one second pipe 12, both ends of the first and second pipes 11, 12 being integrally fixed by holding members (not shown). The first pipe 11 has a line of nozzles (first nozzles) 11a, and the second pipe 12 has a vertical line of nozzles (second nozzles) 12a.

The center axis $O_2$ of the second pipe 12 is positioned at the rotation axis O of the pipe assembly 40, and the first pipe 11 is positioned near the second pipe 12. The first pipe 11 has a radius $R_1$, and the second pipe 12 has a radius $R_2$. The center axis $O_1$ of the first pipe 11 is on a circle $C_1$ of a first diameter $D_1$ around the rotation axis O, and the center axis $O_2$ of the second pipe 12 is positioned at the rotation axis O, with its outer surface in alignment with a circle $C_2$ of a second diameter $D_2$ (=$2R_2$) around the rotation axis O. Because the first diameter $D_1$ is larger than the second diameter $D_2$ [$D_1 \geq 2(R_1+R_2)$], the first nozzles 11a are positioned on a peripheral side, and the second nozzles 12a are positioned inside, when the pipe assembly 40 is rotated around the rotation axis O.

Though the first nozzles 11a of the first pipe 11 and the second nozzles 12a of the second pipe 12 are oriented in just opposite directions (directions of 180°) in the depicted example, it is of course not restrictive, and a center angle $\theta_2$ between the first nozzles 11a and the second nozzles 12a with respect to the rotation axis O may be in a range of 90-180°.

(c) Third Pipe Assembly

FIG. 15(c) shows an example of third pipe assemblies 50 for introducing the mixture gas $A_2$ and the mixture gas $B_2$ without contact into the CVD furnace 1. This pipe assembly 50 comprises four first pipes 11, 11, 11, 11 and one second pipe 12, both ends of the first and second pipes 11, 11, 11, 11, 12 being integrally fixed by holding members (not shown). Each first pipe 11 has a vertical line of nozzles (first nozzles) 11a, and the second pipe 12 has two vertical lines of nozzles (second nozzles) 12a, 12a, 12a, 12a arranged in perpendicularly diametrical directions) (180°. The nozzles (first nozzles) 11a, 11a, 11a, 11a of all first pipes 11, 11, 11, 11 are oriented outward.

The first pipe 11 has a radius $R_1$, and the second pipe 12 has a radius $R_2$. The center axis $O_1$ of the first pipe 11 is on a circle $C_1$ of a first diameter $D_1$ around the rotation axis O. Accordingly, four first pipes 11, 11, 11, 11 are equally distant from the rotation axis O. The center axis $O_2$ of the second pipe 12 is positioned at the rotation axis O, with its outer surface in alignment with a circle $C_2$ of a second diameter $D_2$ (=$2R_2$) around the rotation axis O. Because the first diameter $D_1$ is larger than the second diameter $D_2$ [$D_1 \geq 2(R_1+R_2)$], the first nozzles 11a, 11a, 11a, 11 a are on a peripheral side, and the second nozzles 12a, 12a, 12a, 12a are positioned inside, when the pipe assembly 50 is rotated around the rotation axis O. Though the center angle $\theta_3$ of the center axes $O_1$, $O_1$ of adjacent first pipes 11, 11 with respect to the rotation axis O is 90° in the depicted example, it is not restrictive, but may be 60-120°.

(3) Forming Temperature

The temperature of forming the aluminum nitride coating is preferably 750-850° C. When the forming temperature is lower than 750° C., the resultant aluminum nitride coating contains too much chlorine, exhibiting low hardness. On the other hand, when the forming temperature exceeds 850° C., the resultant aluminum nitride coating has coarse crystal grains, resulting in low adhesion between the lower layer and the upper layer, and low chipping resistance. The temperature of forming the aluminum nitride coating is further preferably 770-830° C.

(4) Forming Pressure

The pressure of forming the aluminum nitride coating is preferably 3-5 kPa. The forming pressure of less than 3 kPa fails to provide a uniform structure. On the other hand, when the forming pressure exceeds 5 kPa, the resultant aluminum nitride coating has coarse crystal grains, resulting in low adhesion between the lower layer and the upper layer, and low chipping resistance.

(5) Continuous Introduction of Starting Material Gases

After forming the titanium aluminum nitride coating as a lower layer, the amount of a $TiCl_4$ gas contained in the mixture gas $A_1$ may be reduced gradually or stepwise to continuously form the aluminum nitride coating as an upper layer. When the amount of a $TiCl_4$ gas in the in the mixture gas $A_1$ reaches 0, the above mixture gas becomes the mixture gas $A_2$ for an upper layer, so that the aluminum nitride coating is formed as an upper layer. By reducing the amount of a $TiCl_4$ gas gradually or stepwise, the continuity of lattice fringes in an interface between the lower layer and the upper layer can be enhanced. After forming the lower layer, the amount of a $TiCl_4$ gas in the mixture gas $A_1$ is preferably reduced at a rate of 0.1-0.5% by volume per minute. With the amount of a $TiCl_4$ gas in the mixture gas $A_1$ reduced gradually or stepwise, the amounts of other gases in the mixture gas $A_1$ and gases in the mixture gas $B_1$ may be properly changed, depending on the composition of the aluminum nitride coating formed as the upper layer.

(D) Formation of Further Upper Layer

Though not particularly restrictive, a further upper layer may be formed on the aluminum nitride coating by a known chemical vapor deposition method. The forming temperature is preferably 700-850° C. Starting material gases used for forming the further upper layers are exemplified as follows:

1. TiC coating: a $TiCl_4$ gas, a $CH_4$ gas, and an $H_2$ gas.
2. CrC coating: a $CrCl_3$ gas, a $CH_4$ gas, and an $H_2$ gas.
3. SiC coating: a $SiCl_4$ gas, a $CH_4$ gas, and an $H_2$ gas.
4. VC coating: a $VCl$ gas, a $CH_4$ gas, and an $H_2$ gas.
5. ZrC coating: a $ZrCl_4$ gas, a $CH_4$ gas, and an $H_2$ gas.
6. TiN coating: a $TiCl_4$ gas, an $N_2$ gas, and an $H_2$ gas.
7. AN coating: an $AlCl_3$ gas, an $NH_3$ gas, and an $H_2$ gas.
8. CrN coating: a $CrCl_3$ gas, an $NH_3$ gas, and an $H_2$ gas.
9. $Si_3N_4$ coating: a $SiCl_4$ gas, an $NH_3$ gas, and an $H_2$ gas.
10. VN coating: a $VCl_3$ gas, an $NH_3$ gas, and an $H_2$ gas.
11. ZrN coating: a $ZrCl_4$ gas, an $N_2$ gas, and an $H_2$ gas.
12. Ti(CN) coating: a $TiCl_4$ gas, a $CH_4$ gas, an $N_2$ gas, and an $H_2$ gas, or a $TiCl_4$ gas, a $CH_3CN$ gas, an $N_2$ gas, and an $H_2$ gas.
13. (TiSi)N coating: a $TiCl_4$ gas, a $SiCl_4$ gas, an $N_2$ gas, and an $NH_3$ gas.
14. (TiB)N coating: a $TiCl_4$ gas, an $N_2$ gas, and a $BCl_3$ gas.
15. TiZr(CN) coating: a $TiCl_4$ gas, a $ZrCl_4$ gas, an $N_2$ gas, a $CH_4$ gas, and an $H_2$ gas, or a $TiCl_4$ gas, a $ZrCl_4$ gas, an $N_2$ gas, a $CH_3CN$ gas, and an $H_2$ gas.
16. TiAl(CN) coating: a $TiCl_4$ gas, an $AlCl_3$ gas, an $N_2$ gas, a $CH_4$ gas, an $NH_3$ gas, and an $H_2$ gas, or a $TiCl_4$ gas, an $AlCl_3$ gas, an $N_2$ gas, a $CH_3CN$ gas, and an $H_2$ gas.

17. TiSi(CN) coating: a $TiCl_4$ gas, a $SiCl_4$ gas, an $N_2$ gas, a $CH_4$ gas, an $NH_3$ gas, and an $H_2$ gas, or a $TiCl_4$ gas, a $SiCl_4$ gas, an $N_2$ gas, a $CH_3CN$ gas, and an $H_2$ gas.

18. TiCr(CN) coating: a $TiCl_4$ gas, a $CrCl_3$ gas, an $N_2$ gas, a $CH_4$ gas, an $NH_3$ gas, and an $H_2$ gas, or a $TiCl_4$ gas, a $CrCl_3$ gas, an $N_2$ gas, a $CH_3CN$ gas, and an $H_2$ gas.

19. TiV(CN) coating: a $TiCl_4$ gas, a $VCl_3$ gas, an $N_2$ gas, a $CH_4$ gas, an $NH_3$ gas, and an $H_2$ gas, or a $TiCl_4$ gas, a $VCl_3$ gas, an $N_2$ gas, a $CH_3CN$ gas, and an $H_2$ gas.

20. TiZr(CN) coating: a $TiCl_4$ gas, a $ZrCl_3$ gas, an $N_2$ gas, a $CH_4$ gas, an $NH_3$ gas, and an $H_2$ gas, or a $TiCl_4$ gas, a $ZrCl_4$ gas, an $N_2$ gas, a $CH_3CN$ gas, and an $H_2$ gas.

21. Ti(CNO) coating: a $TiCl_4$ gas, an $N_2$ gas, a $CH_4$ gas, a CO gas, and an $H_2$ gas, or a $TiCl_4$ gas, an $N_2$ gas, a $CH_3CN$ gas, a CO gas, and an $H_2$ gas.

22. TiAl(CNO) coating: a $TiCl_4$ gas, an $AlCl_3$ gas, an $N_2$ gas, a $CH_4$ gas, a CO gas, and an $H_2$ gas, or a $TiCl_4$ gas, an $AlCl_3$ gas, an $N_2$ gas, a $CH_3CN$ gas, a CO gas, and an $H_2$ gas.

23. Ti(CO) coating: a $TiCl_4$ gas, an $N_2$ gas, a $CH_4$ gas, a CO gas, a $CO_2$ gas, and an $H_2$ gas.

24. $TiB_2$ coating: a $TiCl_4$ gas, a $BCl_3$ gas, and an $H_2$ gas.

(E) Treatment of Cutting Edge after Farming Hard Coating

The hard coating of the present invention formed on the substrate is smoothed by brushing, buffing, blasting, etc., to achieve a surface state having excellent chipping resistance. Particularly when a hard-coated cutting edge is treated by wet and/or dry blasting using at least one ceramic powder of alumina, zirconia, silica, etc., the hard coating is provided with smoothed surface and reduced residual tensile stress, thereby getting improved chipping resistance.

The present invention will be explained in further detail by Examples below, of course without intention of restricting the present invention thereto. In Examples and Comparative Examples below, the flow rate (L/minute) is expressed by L per every minute at 1 atom and 25° C., and the thickness is expressed by an average value.

Example 1

(1) Formation of Hard Coating (i) Primer Layer

Figure 11A:
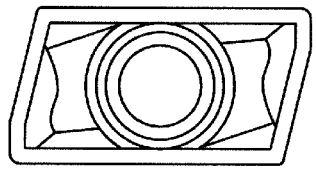
FIG. 11(a) is a schematic plan view showing a milling insert.
Figure 11B:
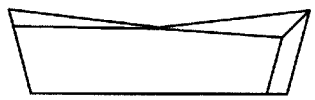
FIG. 11(b) is a side view showing the milling insert of FIG. 11(a).
Figure 12A:
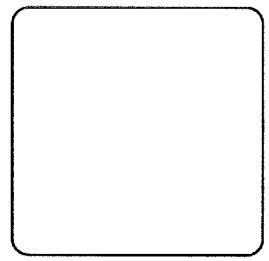
FIG. 12(a) is a schematic plan view showing a property-evaluating insert.
Figure 12B:
FIG. 12(b) is a side view of the property-evaluating insert of FIG. 12(a).

Milling insert substrates (JDMT150508R-C7) of WC-based cemented carbide comprising 11.5% by mass of Co, 2.0% by mass of TaC, and 0.7% by mass of CrC, the balance being WC and inevitable impurities, which are schematically shown in FIGS. 11(a) and 11(b), and property-evaluating insert substrates (SNMN120408) of WC-based cemented carbide comprising 7% by mass of Co, 0.6% by mass of CrC, 2.2% by mass of ZrC, 3.3% by mass of TaC, and 0.2% by mass of NbC, the balance being WC and inevitable impurities, which are schematically shown in FIGS. 12(a) and 12(b), were set in the CVD furnace 1 shown in FIG. 14 [using the first pipe assembly 30 shown in FIG. 15(a)], and the temperature in the CVD furnace 1 was elevated to 790° C. while flowing an $H_2$ gas. Thereafter, a starting material gas comprising 83.5% by volume of an $H_2$ gas, 15.0% by volume of an $N_2$ gas, and 1.5% by volume of a $TiCl_4$ gas was introduced at a flow rate of 67 L/minute into the CVD furnace 1 through the second nozzles 12a of the second pipe 12, at 790° C. and a forming pressure of 12 kPa. Thus, a 0.1-μm-thick titanium nitride primer layer was formed on each substrate by a chemical vapor deposition method.

(ii) Lower Layer

After the temperature in the CVD furnace 1 was elevated to 800° C. with the pressure decreased to 4 kPa while flowing an $H_2$ gas, the pipe assembly 30 rotating at a speed of 2 rpm was used to introduce a mixture gas $A_1$ comprising 0.15% by volume of a $TiCl_4$ gas, 0.45% by volume of an $AlCl_3$ gas, 7.50% by volume of an $N_2$ gas, and 52.51% by volume of an $H_2$ gas through the first nozzles 11a, 11a of the first pipes 11, 11, and a mixture gas $B_1$ comprising 30.76% by volume of an $H_2$ gas, 7.50% by volume of an $N_2$ gas, and 1.13% by volume of an $NH_3$ gas through the second nozzles 12a of the second pipe 12, into the CVD furnace 1. The total flow rate of the mixture gases $A_1$ and $B_1$ was 65 L/minute. Thus, a 5-μm-thick titanium aluminum nitride coating having a composition of $Ti_{0.15}Al_{0.34}N_{0.51}$ (atomic ratio) was formed as a lower layer on the primer layer by a chemical vapor deposition method.

(iii) Upper Layer

The pipe assembly 30 rotating at a speed of 2 rpm was used to introduce a mixture gas $A_2$ comprising 0.9% by volume of an $AlCl_3$ gas, 21.2% by volume of an $N_2$ gas, and 34.7% by volume of an $H_2$ gas through the first nozzles 11a, 11a of the first pipes 11, 11, and a mixture gas $B_2$ comprising 21.2% by volume of an $H_2$ gas, 21.2% by volume of an $N_2$ gas, and 0.8% by volume of an $NH_3$ gas through the second nozzles 12a of the second pipe 12, into the CVD furnace 1 at 800° C. and 4 kPa. The total flow rate of the mixture gases $A_2$ and $B_2$ was 85 L/minute. Thus, a 1.5-μm-thick aluminum nitride having a composition of $Al_{0.51}N_{0.49}$ (atomic ratio) was formed as an upper layer on the lower layer by a chemical vapor deposition method, thereby producing a hard-coated tool having the hard coating of the present invention.

(2) Measurement of Thickness

The thicknesses of the primer layer, the lower and upper layers in the resultant hard-coated tool were measured by the following methods: The coating surface was lapped slantingly at an angle of 5° to expose a lapped surface (thickness-direction cross section of the hard coating), and the lapped surface was observed by an optical microscope of 1,000 times at five arbitrary points to measure the thickness of each layer, and the measured thicknesses were arithmetically averaged.

(3) Crystal Structure and Average Transverse Cross Section Diameter of Columnar Crystals in Hard Coating On a fractured surface of the property-evaluating insert of each hard-coated tool, the crystal structure was observed by SEM (S-4200 available from Hitachi, Ltd.), and a field-emission transmission electron microscope FE-TEM (JEM-2010F available from JEOL Ltd.).

Figure 1B:
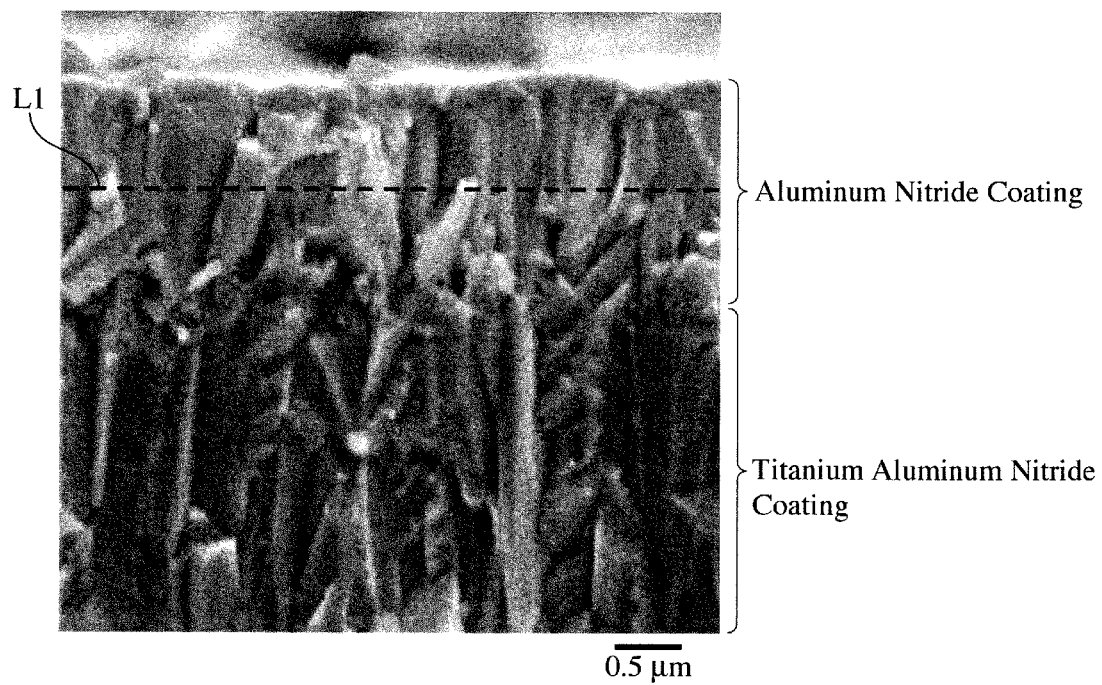
FIG. 1(b) is a scanning electron photomicrograph (SEM photograph) (magnification: 20,000 times) showing a cross section of the hard-coated tool of Example 1.

FIG. 1(a) is a SEM photograph (magnification: 10,000 times) of a fractured surface (vertical fractured surface along the thickness direction) including the hard coating on a rake face of the property-evaluating insert, and FIG. 1(b) is a SEM photograph (magnification: 20,000 times) enlargedly showing part of the aluminum nitride coating and the titanium aluminum nitride coating in FIG. 1(a). It is clear from FIGS. 1(a) and 1(b) that both of the titanium aluminum nitride coating and the aluminum nitride coating had a columnar crystal structure. Measurement on FIG. 1(b) revealed that the average transverse cross section diameter of columnar crystals in the aluminum nitride coating was 0.20 μm.

Figure 2:
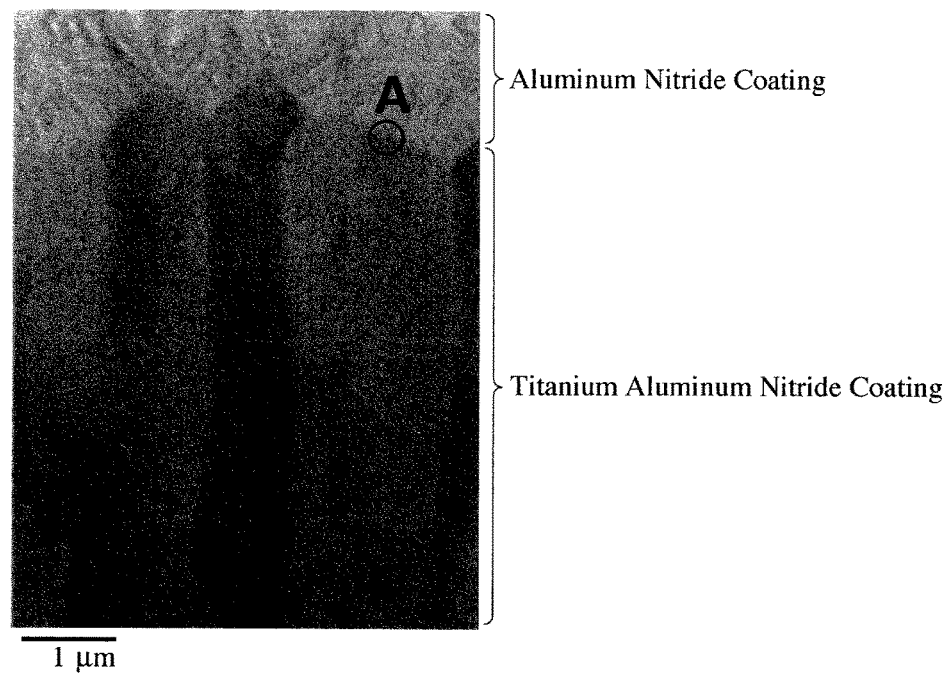
FIG. 2 is a transmission electron photomicrograph (TEM photograph) (magnification: 12,000 times) showing a cross section of the hard-coated tool of Example 1.
Figure 3:
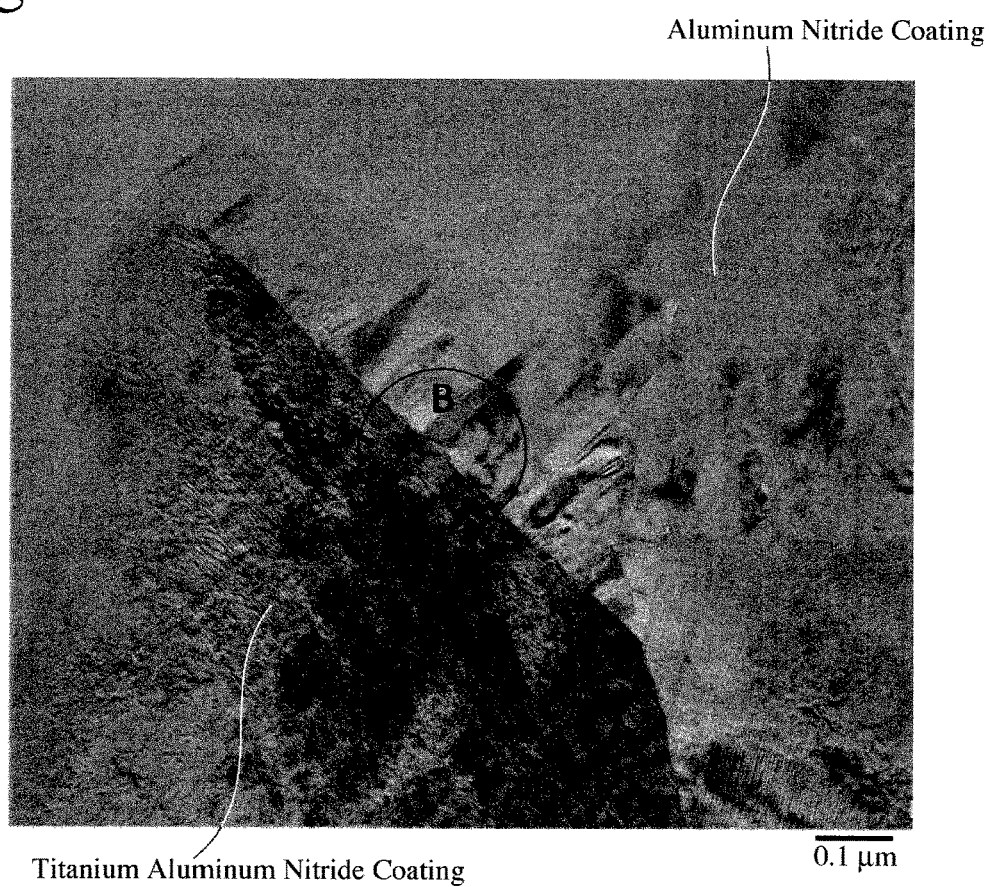
FIG. 3 is a TEM photograph (magnification: 200,000 times) enlargedly showing a portion A in FIG. 2.
Figure 4:
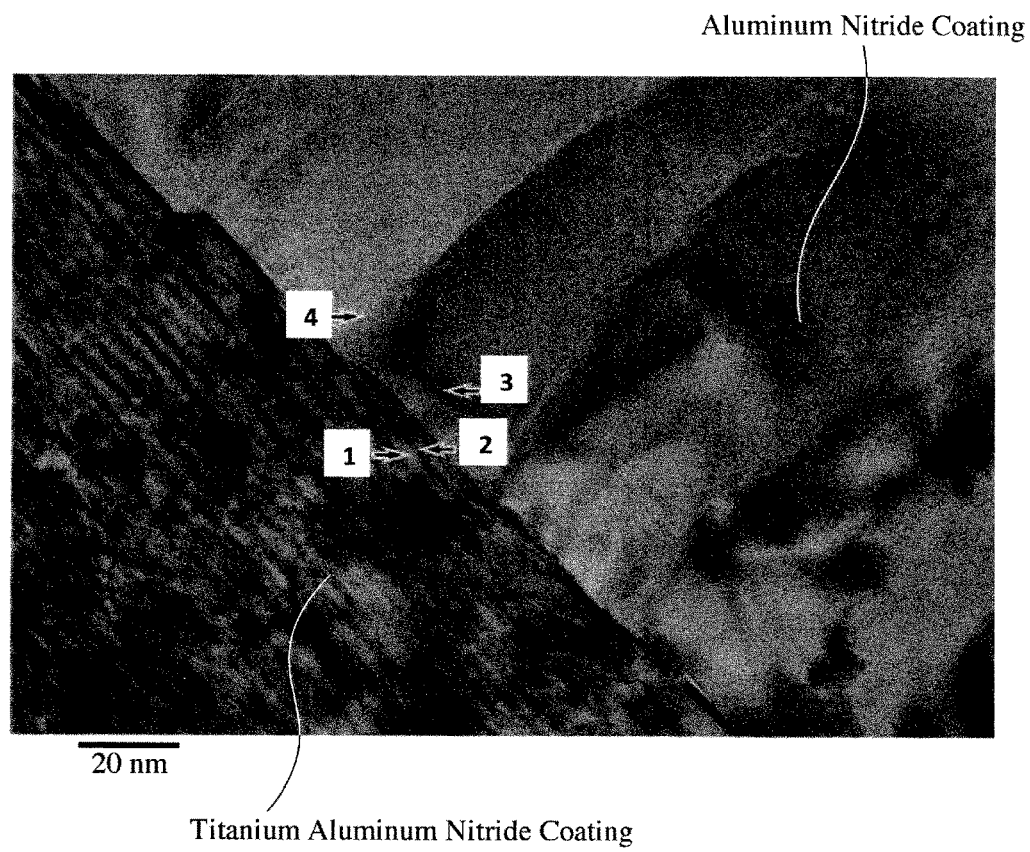
FIG. 4 is a TEM photograph (magnification: 1,000,000 times) enlargedly showing a portion B in FIG. 3.

FIG. 2 is a TEM photograph (magnification: 12,000 times) of a cross section of the property-evaluating insert, FIG. 3 is a TEM photograph (magnification: 200,000 times) enlargedly showing a cross section of a portion A in FIG. 2, and FIG. 4 is a TEM photograph (magnification: 1,000,000 times) enlargedly showing of a cross section of a portion B in FIG. 3. FIG. 9(a) is a TEM photograph (magnification:

4,000,000 times) enlargedly showing an area including the analysis points 1-4 in FIG. 4.

The nanobeam diffractions (NAD) of pale gray portions C (first crystal phase) and black portions D (second crystal phase) in the titanium aluminum nitride coating (lower layer) in FIG. 9(a) by FE-TEM (JEM-2010F) revealed that both portions C and D had an fcc crystal system. The nanobeam diffraction conditions were acceleration voltage of 200 kV and camera length of 50 cm.

Using an energy-dispersive X-ray spectrometer EDS (UTW-type Si (Li) semiconductor detector available from NORAN, beam diameter: about 1 nm) attached to FE-TEM (JEM-2010F), the composition analysis of gray portions (first crystal phase) including the fine structure portions C and black portions (second crystal phase) including the portions D was conducted at five arbitrary points for each portion in FIG. 9(a), and the measured values were arithmetically averaged. As a result, it was found that the first crystal phase was high-Al-content TiAlN having a composition of $(Ti_{0.03}Al_{0.97})N$ by atomic ratio, and that the second crystal phase was high-Ti-content TiAlN having a composition of $(Ti_{0.68}Al_{0.32})N$ by atomic ratio (see Table 5).

FIGS. 5 and 6 showing the nanobeam diffraction (NAD) of the titanium aluminum nitride coating (lower layer) at the analysis points 1 and 2 (FIG. 4) indicate that the titanium aluminum nitride coating (lower layer) had an fcc crystal system.

FIGS. 7 and 8 showing the nanobeam diffraction (NAD) of the aluminum nitride coating (upper layer) at the analysis points 3 and 4 (FIG. 4) indicate that the aluminum nitride coating (upper layer) had an hcp crystal system.

(4) Measurement of Composition

In a cross section of the property-evaluating insert, each composition of the lower and upper layers was measured at five arbitrary points at its thickness-direction center by an electron probe microanalyzer EPMA (JXA-8500F available from JEOL, Ltd.), under the conditions of acceleration voltage of 10 kV, irradiation current of 0.05 A, and a beam diameter of 0.5 µm. The measured values were arithmetically averaged to determine the compositions of the lower and upper layers. The results are shown in Table 2. The compositions of the lower and upper layers are shown in Tables 4-3 and 6-3.

(5) Identification of Crystal System

Figure 10:
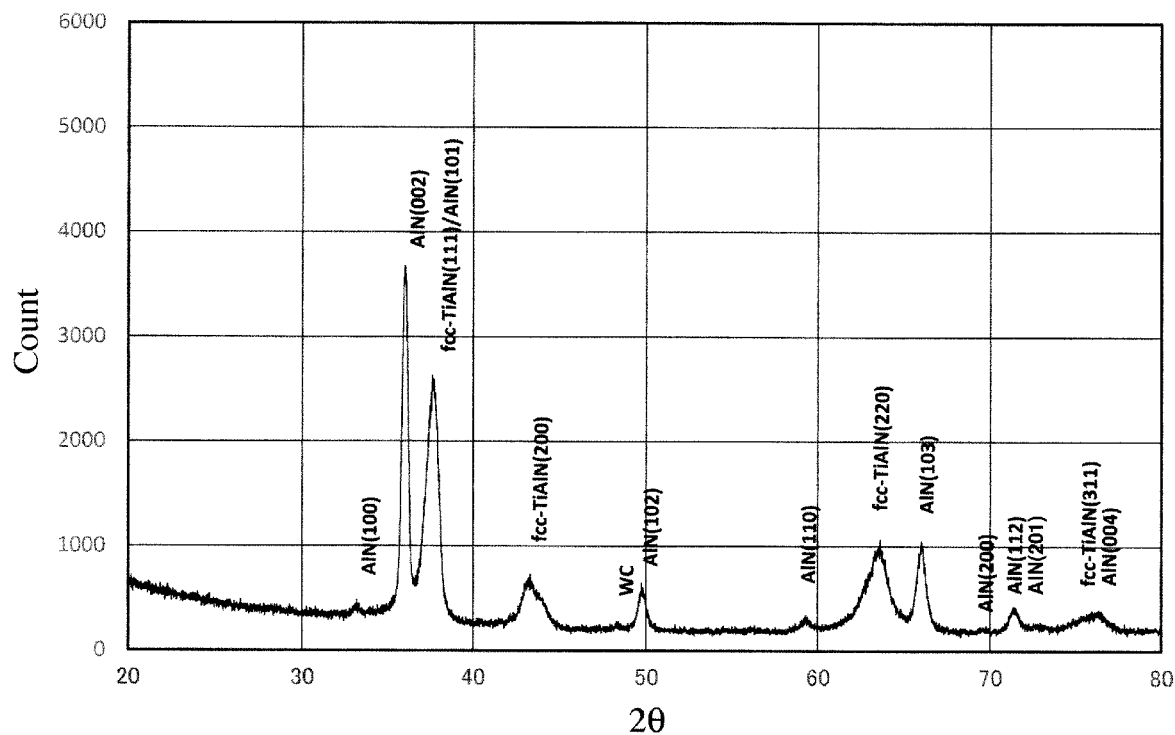
FIG. 10 is a graph showing an X-ray diffraction pattern of the hard coating (titanium aluminum nitride coating and aluminum nitride coating) of Example 1.

Using an X-ray diffraction apparatus (EMPYREAN available from PANalytical), $CuK\alpha_1$ rays (wavelength λ: 0.15405 nm) were projected onto a hard coating surface on a rake face of the property-evaluating insert under the fixed conditions of tube voltage of 45 kV, tube current of 40 mA and an incident angle co of 4°, to identify the crystal structure. The X-ray diffraction pattern obtained in a 2θ range of 20-80° is shown in FIG. 10. In this X-ray diffraction pattern, the diffraction peaks of the titanium aluminum nitride coating having an fcc crystal system and the aluminum nitride coating having an hcp crystal system were observed.

To identify the diffraction peaks, the X-ray diffraction database of ICDD was used. Because there is no ICDD data in titanium aluminum nitride having an fcc crystal system, the ICDD file of aluminum nitride having an fcc crystal system was used instead. Table 1 shows the standard X-ray diffraction intensity Io and diffraction angle 2θ of each crystal plane of titanium aluminum nitride having an fcc crystal system (ICDD File No. 00-008-0262). Table 2 shows the standard X-ray diffraction intensity Io and diffraction angle 2θ of each crystal plane of aluminum nitride having an hcp crystal system (ICDD File No. 00-025-1495). Table 1 indicates that titanium aluminum nitride having an fcc crystal system has high X-ray diffraction intensity of (200) planes, and Table 2 indicates that aluminum nitride having an hcp crystal system has high X-ray diffraction intensity of (100) planes.

TABLE 1

| Plane Index | Io | 2θ (°) |
| --- | --- | --- |
| (111) | 20 | 37.79 |
| (200) | 75 | 43.92 |
| (220) | 45 | 63.83 |
| (311) | 13 | 76.66 |

TABLE 2

| Plane Index | Io | 2θ (°) |
| --- | --- | --- |
| (100) | 100 | 33.153 |
| (002) | 60 | 36.041 |
| (101) | 70 | 37.901 |
| (102) | 20 | 49.816 |
| (110) | 30 | 59.304 |
| (103) | 20 | 66.017 |
| (200) | 6 | 69.701 |
| (112) | 18 | 71.403 |
| (201) | 8 | 72.610 |

Table 3 shows main peak values and their diffraction angles 2θ in the X-ray diffraction pattern in FIG. 10, as well as plane indices of crystal planes of aluminum nitride and titanium aluminum nitride corresponding to the peak values. Because a diffraction angle at a peak of (101) planes of the aluminum nitride coating having an hcp crystal system overlaps a diffraction angle at a peak of (111) planes of the titanium aluminum nitride coating having an fcc crystal system, a peak value at a diffraction angle 2θ of 37.80° is a synthesized to value of both peaks.

TABLE 3

| 2θ (°) | Plane Index of TiAlN | Plane Index of AlN | Peak Values (Relative Intensity) |
| --- | --- | --- | --- |
| 33.14 | — | (100) | 84 |
| 35.99 | — | (002) | 3332 |
| 37.80 | (111) | (101) | 1878 |
| 43.95 | (200) | — | 252 |
| 49.73 | — | (102) | 371 |
| 59.39 | — | (110) | 90 |
| 63.89 | (220) | — | 694 |
| 66.02 | — | (103) | 757 |
| 69.80 | — | (200) | 19 |
| 71.31 | — | (112) | 193 |
| 72.67 | — | (201) | 31 |
| 76.41 | (311) | — | 136 |

The peak value ratios Ia(002)/Ia(100), It(111)Ia(101)/Ia(100) and It(111)Ia(101)/It(200) obtained from Table 3 are shown in Table 7.

(6) Interface Between Lower Layer and Upper Layer

Figure 9B:
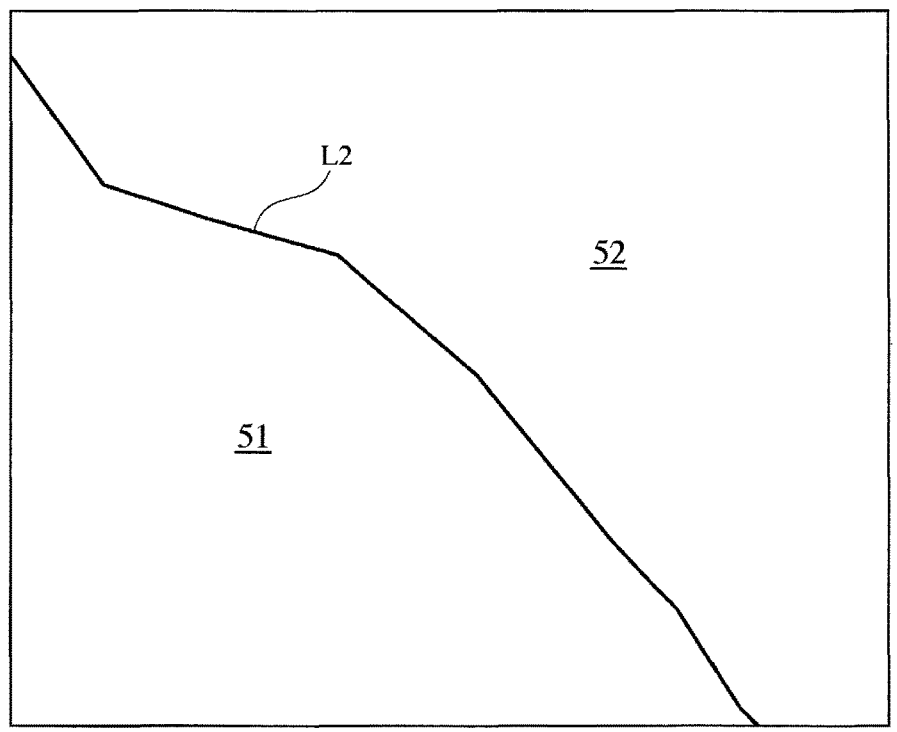
FIG. 9(b) is a schematic view of FIG. 9(a).

An interface between the lower and upper layers is observed in the photograph (magnification: 4,000,000 times) of FIG. 9(a) taken using FE-TEM (JEM-2010F). In FIG. 9(a), 51 denotes the lower layer (titanium aluminum nitride coating having an fcc crystal system), and 52 denotes the upper layer (aluminum nitride coating having an hcp crystal system). FIG. 9(b) is a schematic view of FIG. 9(a). In FIG. 9(b), a line L2 indicates an interface between the lower layer 51 and the upper layer 52, large numbers of fine lines indicate crystal lattice fringes. FIGS. 9(a) and 9(b) indicate that 80% of crystal lattice fringes are continuous in the interface.

(7) Evaluation of Performance

Figure 13:
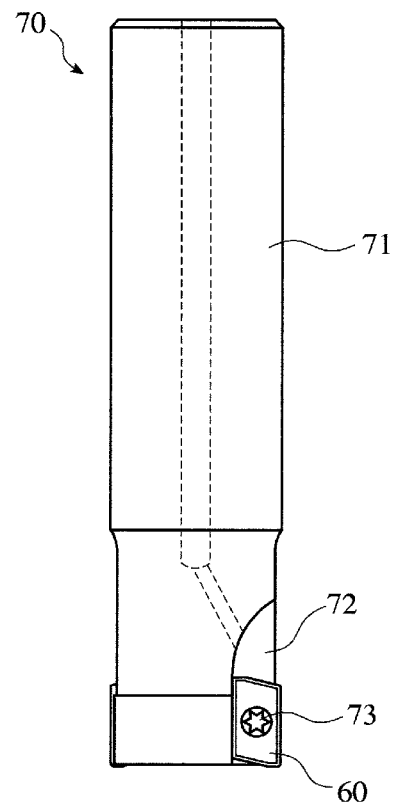
FIG. 13 is a schematic view showing an indexable rotary cutting tool equipped with milling inserts.

With the milling inserts 60 fixed to a tip portion 72 of a tool body 71 of an indexable rotary cutting tool (AHU1025R4) by setscrews 73 as shown in FIG. 13, the tool life of the hard coating was evaluated under the following milling conditions. The wear width of a flank of each hard coating was observed by an optical microscope (magnification: 100 times). The tool life was defined as the entire cutting length (m) when the maximum wear width of a flank exceeded 0.350 mm. The results are shown in Table 7.

Work: SUS630 having hardness of 32HRC,
Machining method: Milling,
Shape of insert: JDMT150508R-C7,
Cutting speed: 200 m/minute,
Rotation speed: 2548 rpm,
Feed per tooth: 0.1 mm/tooth,
Feeding speed: 255 mm/minute,
Axial cutting depth: 4.0 mm,
Radial cutting depth: 20 mm, and
Cutting method: Dry cutting.

Examples 2-11

Hard-coated tools were produced in the same manner as in Example 1, except for changing the conditions of forming the titanium aluminum nitride coating as shown in Tables 4-1 and Table 4-2, and the conditions of forming the aluminum nitride coating as shown in Tables 6-1 and 6-2, and their properties and tool lives were elevated. The measurement results of the composition, crystal system, crystal structure, thickness and microstructure of the lower layer (titanium aluminum nitride coating) in each Example are shown in Table 4-3. The measurement results of the composition, crystal system, crystal structure, average transverse cross section diameter of columnar crystals and thickness of the upper layer (aluminum nitride coating) in each Example are shown in Table 6-3. Ia(002)/Ia(100), It(111)Ia(101)/Ia(100), It(111)Ia(101)/It(200), the continuity of lattice fringes between the upper layer and the lower layer, and tool life in each Example are shown in Table 7.

Tables 4-3, 6-3 and 7 indicate that in Examples 2-11, each lower layer (titanium aluminum nitride coating) had an fcc crystal system, and each upper layer (aluminum nitride coating) had an hcp crystal system, meeting the relations of Ia(002)/Ia(100)≥6, It(111)Ia(101)/Ia(100)≥1.5, and It(111)Ia(101)/It(200)≥1.5, as in Example 1.

In Examples 2 and 4, too, similar TEM photographs to FIG. 9(a) of Example 1 were taken to analyze the compositions and crystal systems of high-Al-content TiAlN and high-Ti-content TiAlN, as in Example 1. The results are shown in Table 5.

Example 12

A hard-coated tool was produced in the same manner as in Example 1, except for introducing the mixture gas $B_1$ from the first nozzles 11a, 11a of the first pipes 11, 11 of the pipe assembly 30, and the mixture gas $A_1$ from the second nozzles 12a, 12a of the second pipe 12 of the pipe assembly 30, into the CVD furnace 1 to form a lower layer, and then introducing the mixture gas $B_2$ from the first nozzles 11a, 11a of the first pipes 11, 11, and the mixture gas $A_2$ from the second nozzles 12a, 12a of the second pipe 12, into the CVD furnace 1 to form an upper layer, and their properties and tool life were measured. The measurement results are shown in Tables 4-3, 6-3 and 7.

Comparative Example 1

Figure 16:
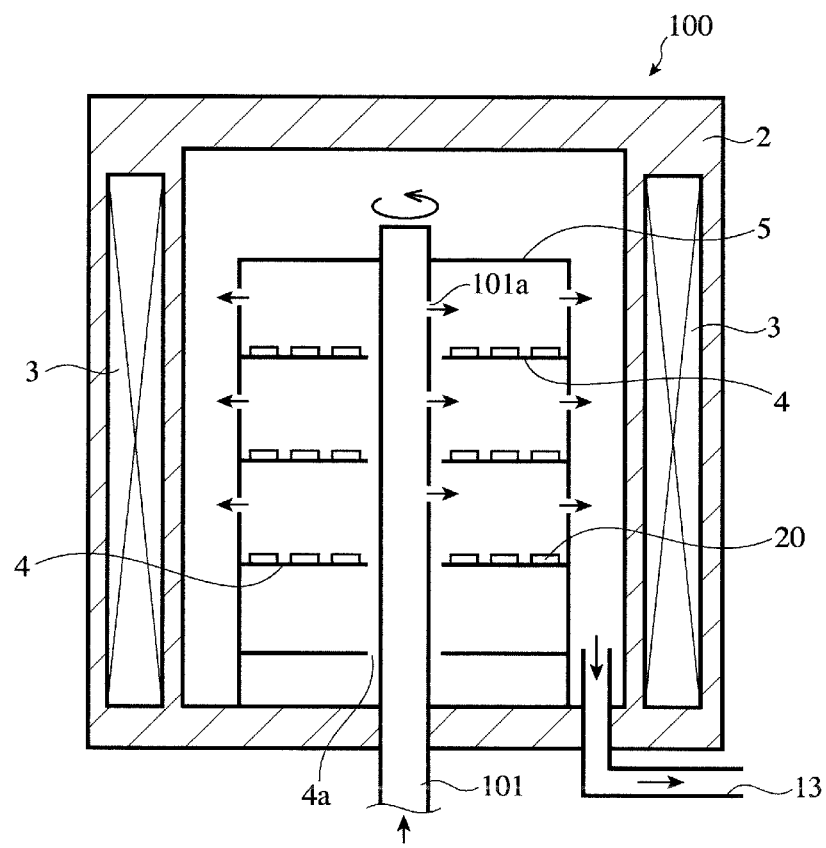
FIG. 16 is a schematic view showing a conventional chemical vapor deposition apparatus (CVD furnace) for forming hard coatings.
Figure 17:
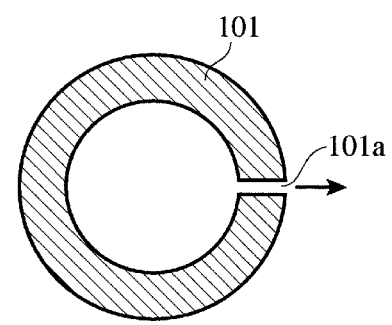
FIG. 17 is a transverse cross-sectional view showing pipes used in the CVD furnace of FIG. 16.

A hard-coated tool was produced in the same manner as in Example 3, except for forming a lower layer in the same manner as in Example 3, and then forming an upper layer by the CVD furnace 100 shown in FIG. 16, and their properties and tool life were measured. The CVD furnace 100 is the same as the CVD furnace 1 of FIG. 14, except for using the pipe 101 having nozzles 101a as shown in FIG. 17, in place of the pipe assembly 30. The measurement results are shown in Tables 4-3, 6-3 and 7.

Tables 4-3, 6-3 and 7 indicate that the aluminum nitride coating (upper layer) was a polycrystal having granular crystal grains, exhibiting a shorter life than that of each Example above. The average transverse cross section diameter of granular crystals was determined as in Example 1, by measuring the width of each granular crystal grain crossing a straight line horizontally drawn at a middle position of the crystal structure in a vertical fractured surface perpendicular to the substrate surface, and arithmetically averaging the measured values.

TABLE 4-1

| No. | Forming Temperature (° C.) | Forming Pressure (kPa) | Apparatus | Nozzles for Ejecting Mixture Gas | |
|---|---|---|---|---|---|
| | | | | Mixture Gas $A_1$ | Mixture Gas $B_1$ |
| Example 1 | 800 | 4 | FIGS. 14 and 15(a) | First Nozzles | Second Nozzles |
| Example 2 | 750 | 4 | FIGS. 14 and 15(a) | First Nozzles | Second Nozzles |
| Example 3 | 850 | 6 | FIGS. 14 and 15(a) | First Nozzles | Second Nozzles |
| Example 4 | 800 | 4 | FIGS. 14 and 15(a) | First Nozzles | Second Nozzles |
| Example 5 | 800 | 5 | FIGS. 14 and 15(a) | First Nozzles | Second Nozzles |
| Example 6 | 800 | 6 | FIGS. 14 and 15(a) | First Nozzles | Second Nozzles |
| Example 7 | 800 | 4 | FIGS. 14 and 15(a) | First Nozzles | Second Nozzles |
| Example 8 | 800 | 4 | FIGS. 14 and 15(a) | First Nozzles | Second Nozzles |
| Example 9 | 800 | 4 | FIGS. 14 and 15(a) | First Nozzles | Second Nozzles |
| Example 10 | 800 | 4 | FIGS. 14 and 15(a) | First Nozzles | Second Nozzles |
| Example 11 | 800 | 4 | FIGS. 14 and 15(a) | First Nozzles | Second Nozzles |
| Example 12 | 800 | 4 | FIGS. 14 and 15(a) | Second Nozzles | First Nozzles |
| Com. Ex. 1 | 850 | 6 | FIGS. 14 and 15(a) | First Nozzles | Second Nozzles |

TABLE 4-2

Lower Layer (TiAlN Coating)
Composition of First Starting Material Gas (% by volume)

| No. | Mixture Gas $A_1$ | | | | Mixture Gas $B_1$ | | | $H_2(A_1)/H_2(B_1)$[(1)] |
|---|---|---|---|---|---|---|---|---|
| | $TiCl_4$ | $AlCl_3$ | $N_2$ | $H_2$ | $H_2$ | $N_2$ | $NH_3$ | |
| Example 1 | 0.15 | 0.45 | 7.50 | 52.51 | 30.76 | 7.50 | 1.13 | 1.71 |
| Example 2 | 0.15 | 0.45 | 7.50 | 52.51 | 30.76 | 7.50 | 1.13 | 1.71 |
| Example 3 | 0.15 | 0.45 | 7.50 | 52.51 | 30.76 | 7.50 | 1.13 | 1.71 |
| Example 4 | 0.15 | 0.45 | 7.50 | 52.51 | 30.76 | 7.50 | 1.13 | 1.71 |
| Example 5 | 0.15 | 0.45 | 7.50 | 52.51 | 30.76 | 7.50 | 1.13 | 1.71 |
| Example 6 | 0.16 | 0.16 | 7.51 | 52.67 | 30.85 | 7.52 | 1.13 | 1.71 |
| Example 7 | 0.31 | 0.45 | 7.49 | 52.43 | 30.71 | 7.49 | 1.12 | 1.71 |
| Example 8 | 0.15 | 0.35 | 7.50 | 52.61 | 30.76 | 7.50 | 1.13 | 1.71 |
| Example 9 | 0.13 | 0.28 | 7.50 | 52.70 | 30.76 | 7.50 | 1.13 | 1.71 |
| Example 10 | 0.15 | 0.19 | 9.50 | 50.57 | 30.76 | 7.50 | 1.33 | 1.64 |
| Example 11 | 0.15 | 0.45 | 7.50 | 52.51 | 30.76 | 7.50 | 1.13 | 1.71 |
| Example 12 | 0.15 | 0.45 | 7.50 | 52.51 | 30.76 | 7.50 | 1.13 | 1.71 |
| Com. Ex. 1 | 0.15 | 0.45 | 7.50 | 52.51 | 30.76 | 7.50 | 1.13 | 1.71 |

Note:
[(1)] A volume ratio of an $H_2$ gas in the mixture gas $A_1$ to an $H_2$ gas in the mixture gas $B_1$.

TABLE 4-3

Lower Layer (TiAlN coating)

| No. | Composition (Atomic Ratio) | | | Crystal System | Crystal Structure | Thickness (μm) |
|---|---|---|---|---|---|---|
| | Ti | Al | N | | | |
| Example 1 | 0.15 | 0.34 | 0.51 | fcc | Columnar[(1)] | 5 |
| Example 2 | 0.13 | 0.35 | 0.52 | fcc | Columnar[(1)] | 5 |
| Example 3 | 0.17 | 0.25 | 0.58 | fcc | Granular[(2)] | 5 |
| Example 4 | 0.16 | 0.32 | 0.52 | fcc | Columnar[(1)] | 5 |
| Example 5 | 0.17 | 0.33 | 0.50 | fcc | Columnar[(1)] | 5 |
| Example 6 | 0.21 | 0.26 | 0.53 | fcc | Columnar[(1)] | 5 |
| Example 7 | 0.22 | 0.25 | 0.53 | fcc | Columnar[(1)] | 5 |
| Example 8 | 0.12 | 0.35 | 0.53 | fcc | Columnar[(1)] | 5 |
| Example 9 | 0.13 | 0.36 | 0.51 | fcc | Columnar[(1)] | 5 |
| Example 10 | 0.20 | 0.28 | 0.52 | fcc | Columnar[(1)] | 2 |
| Example 11 | 0.10 | 0.36 | 0.54 | fcc | Columnar[(1)] | 8 |
| Example 12 | 0.14 | 0.34 | 0.52 | fcc | Columnar[(1)] | 5 |
| Com. Ex. 1 | 0.18 | 0.26 | 0.56 | fcc | Granular[(2)] | 5 |

Note:
[(1)] High-Al-content TiAlN was surrounded by network-shaped, high-Ti-content TiAlN.
[(2)] Polycrystal of granular crystal grains.

TABLE 5

| No. | High-Al-Content TiAlN | | | High-Ti-Content TiAlN | | |
|---|---|---|---|---|---|---|
| | $(Ti_{x1}Al_{y1})$ (Atomic Ratio) | | Crystal System | $(Ti_{x2}Al_{y2})$ (Atomic Ratio) | | Crystal System |
| | $x_1$ | $y_1$ | | $x_2$ | $y_2$ | |
| Example 1 | 0.03 | 0.97 | fcc | 0.68 | 0.32 | fcc |
| Example 2 | 0.05 | 0.95 | fcc | 0.58 | 0.42 | fcc |
| Example 4 | 0.08 | 0.92 | fcc | 0.71 | 0.29 | fcc |

TABLE 6-1

| No. | Forming Temperature (°C) | Forming Pressure (kPa) | Nozzles for Ejecting Mixture Gas | | |
|---|---|---|---|---|---|
| | | | Apparatus | Mixture Gas $A_2$ | Mixture Gas $B_2$ |
| Example 1 | 800 | 4 | FIGS. 14 and 15(a) | First Nozzles | Second Nozzles |
| Example 2 | 750 | 4 | FIGS. 14 and 15(a) | First Nozzles | Second Nozzles |
| Example 3 | 850 | 5 | FIGS. 14 and 15(a) | First Nozzles | Second Nozzles |
| Example 4 | 800 | 3 | FIGS. 14 and 15(a) | First Nozzles | Second Nozzles |
| Example 5 | 800 | 5 | FIGS. 14 and 15(a) | First Nozzles | Second Nozzles |
| Example 6 | 800 | 4 | FIGS. 14 and 15(a) | First Nozzles | Second Nozzles |
| Example 7 | 800 | 4 | FIGS. 14 and 15(a) | First Nozzles | Second Nozzles |
| Example 8 | 800 | 4 | FIGS. 14 and 15(a) | First Nozzles | Second Nozzles |
| Example 9 | 800 | 4 | FIGS. 14 and 15(a) | First Nozzles | Second Nozzles |
| Example 10 | 800 | 4 | FIGS. 14 and 15(a) | First Nozzles | Second Nozzles |
| Example 11 | 800 | 4 | FIGS. 14 and 15(a) | First Nozzles | Second Nozzles |
| Example 12 | 800 | 4 | FIGS. 14 and 15(a) | Second Nozzles | First Nozzles |
| Com. Ex. 1[(1)] | 850 | 5 | FIGS. 16 and 17 | Nozzle | — |

Note:
[(1)] The mixture gas $A_2$ was used as a single-composition starting material gas.

TABLE 6-2

| | Upper Layer (AlN Coating) Composition of Second Starting Material Gas (% by volume) | | | | | | | |
|---|---|---|---|---|---|---|---|---|
| | Mixture Gas A$_2$ | | | | Mixture Gas B$_2$ | | | |
| No. | H$_2$ | N$_2$ | AlCl$_3$ | NH$_3$ | H$_2$ | N$_2$ | NH$_3$ | H$_2$(A$_2$)/H$_2$(B$_2$)[(1)] |
| Example 1 | 34.70 | 21.20 | 0.90 | — | 21.20 | 21.20 | 0.80 | 1.64 |
| Example 2 | 34.70 | 21.20 | 0.90 | — | 21.20 | 21.20 | 0.80 | 1.64 |
| Example 3 | 34.70 | 21.20 | 0.90 | — | 21.20 | 21.20 | 0.80 | 1.64 |
| Example 4 | 34.70 | 21.20 | 0.90 | — | 21.20 | 21.20 | 0.80 | 1.64 |
| Example 5 | 34.70 | 21.20 | 0.90 | — | 21.20 | 21.20 | 0.80 | 1.64 |
| Example 6 | 34.20 | 21.20 | 1.40 | — | 21.20 | 21.20 | 0.80 | 1.61 |
| Example 7 | 35.10 | 21.20 | 0.50 | — | 21.20 | 21.20 | 0.80 | 1.66 |
| Example 8 | 34.60 | 21.20 | 0.90 | — | 21.20 | 21.20 | 0.90 | 1.63 |
| Example 9 | 34.90 | 21.20 | 0.90 | — | 21.20 | 21.20 | 0.60 | 1.65 |
| Example 10 | 55.90 | 10.60 | 0.90 | — | 21.20 | 10.60 | 0.80 | 2.64 |
| Example 11 | 15.90 | 30.60 | 0.90 | — | 21.20 | 30.60 | 0.80 | 0.75 |
| Example 12 | 34.70 | 21.20 | 0.90 | — | 21.20 | 21.20 | 0.80 | 1.64 |
| Com. Ex. 1 | 55.90 | 42.40 | 0.90 | 0.80 | — | — | — | — |

Note:
[(1)] A volume ratio of an H$_2$ gas in the mixture gas A$_2$ to an H$_2$ gas in the mixture gas B$_2$.

TABLE 6-3

| | Upper Layer (AlN Coating) | | | | | |
|---|---|---|---|---|---|---|
| | Composition (atomic %) | | Crystal System | Crystal Structure | Dav[(1)] of Columnar Crystals (μm) | Thickness (μm) |
| No. | Al | N | | | | |
| Example 1 | 50.8 | 49.2 | hcp | Columnar | 0.20 | 1.5 |
| Example 2 | 47.8 | 52.2 | hcp | Columnar | 0.05 | 0.5 |
| Example 3 | 51.6 | 48.4 | hcp | Columnar | 0.58 | 3.0 |
| Example 4 | 49.6 | 50.4 | hcp | Columnar | 0.12 | 1.5 |
| Example 5 | 50.2 | 49.8 | hcp | Columnar | 0.36 | 1.5 |
| Example 6 | 50.5 | 49.5 | hcp | Columnar | 0.45 | 1.5 |
| Example 7 | 49.7 | 50.3 | hcp | Columnar | 0.40 | 1.5 |
| Example 8 | 50.5 | 49.5 | hcp | Columnar | 0.18 | 1.5 |
| Example 9 | 49.7 | 50.3 | hcp | Columnar | 0.22 | 1.5 |
| Example 10 | 49.4 | 50.6 | hcp | Columnar | 0.48 | 1.5 |
| Example 11 | 50.9 | 49.1 | hcp | Columnar | 0.18 | 1.5 |
| Example 12 | 50.2 | 49.8 | hcp | Columnar | 0.24 | 1.5 |
| Com. Ex. 1 | 51.2 | 48.7 | hcp | Granular | 0.85[(2)] | 3.0 |

Note:
[(1)] Dav represents an average transverse cross section diameter.
[(2)] Average transverse cross section diameter of granular crystals.

TABLE 7

| No. | Ia(002)/ Ia(100) | It(111)Ia(101)/ Ia(100) | It(111)Ia(101)/ It(200) | Lattice Fringes of Upper Layer and Lower Layer | Continuity of Lattice Fringes (%) | Tool Life (m) |
|---|---|---|---|---|---|---|
| Example 1 | 39.7 | 22.4 | 7.5 | Continuous | 80 | 12.0 |
| Example 2 | 12.5 | 1.8 | 2.0 | Continuous | 40 | 6.5 |
| Example 3 | 6.0 | 1.5 | 1.5 | Continuous | 35 | 5.0 |
| Example 4 | 30.5 | 15.2 | 6.5 | Continuous | 80 | 11.5 |
| Example 5 | 22.2 | 10.2 | 5.2 | Continuous | 60 | 9.0 |
| Example 6 | 9.5 | 8.2 | 3.2 | Continuous | 40 | 7.5 |
| Example 7 | 12.5 | 9.5 | 2.1 | Continuous | 50 | 8.5 |
| Example 8 | 23.2 | 14.5 | 5.3 | Continuous | 75 | 10.5 |
| Example 9 | 33.4 | 16.4 | 6.2 | Continuous | 65 | 11.5 |
| Example 10 | 10.3 | 1.9 | 3.5 | Continuous | 45 | 8.0 |
| Example 11 | 18.2 | 16.5 | 4.8 | Continuous | 70 | 10.0 |
| Example 12 | 19.2 | 16.4 | 5.1 | Continuous | 60 | 10.0 |
| Com. Ex. 1 | 3.3 | 1.0 | 1.2 | Discontinuous | 20 | 2.5 |

Each hard-coated tool of Examples 1-12 had a tool life of 5.0 m or more as a cutting distance, 2 times or more that of Comparative Example 1. It is considered that because of the above characteristic crystal orientation (columnar crystal), the aluminum nitride coating of each hard-coated tool of Examples 1-12 has good adhesion to the titanium aluminum nitride coating (lower layer), and excellent chipping resistance, thereby exhibiting a long tool life.

On the other hand, the aluminum nitride coating of Comparative Example 1 has granular crystal grains, failing to meet the relation of the X-ray diffraction peak value ratio: Ia(002)/Ia(100)≥6. Accordingly, it has poor adhesion to the titanium aluminum nitride coating (lower layer), suffering the peeling of the aluminum nitride coating and the chipping of the hard-coated tool, thereby exhibiting a short life.

Though a practical example of the hard coatings of the present invention is a cutting tool in Examples above, it is not restrictive. For example, hard-coated members (dies, etc.) having the hard coating of the present invention are also extremely useful, exhibiting the effects of the present invention. Though the lower layer was formed by the CVD furnace 1 in Examples above, it is also not restrictive. For example, when the titanium aluminum nitride coating (lower layer) having a columnar or granular crystal structure is formed by other CVD furnaces, the hard coating of the present invention can also exhibit the above effects.

DESCRIPTION OF REFERENCE NUMERALS

1: CVD furnace
2: Chamber
3: Heater
4: Shelf
4a: Center opening of shelf
5: Reaction vessel
11: First pipe
11a: First nozzle
12: Second pipe
12a: Second nozzle
13: Discharge pipe
20: Insert substrate
30: First pipe assembly
40: Second pipe assembly
50: Third pipe assembly
51: Lower layer
52: Upper layer
60: Milling insert
70: Indexable rotary cutting tool
71: Tool body
72: Tip portion
73: Setscrew
L1: Straight line
L2: Interface

What is claimed is:

1. A hard coating comprising a lower layer formed by an fcc-based titanium aluminum nitride coating and an upper layer formed by an aluminum nitride coating having an hcp crystal system;
said upper layer having a columnar crystal structure,
said columnar crystals having an average transverse cross section diameter of 0.05-0.6 µm,
said lower layer having a columnar crystal structure, and
a ratio of an X-ray diffraction peak value Ia(002) of (002) planes to an X-ray diffraction peak value Ia(100) of (100) planes in said upper layer meeting the relation of Ia(002)/Ia(100)≥6.

2. The hard coating according to claim 1, wherein a ratio of a merged X-ray diffraction peak value It(111)Ia(101) of the (111) planes of said lower layer and the (101) planes of said upper layer to said Ia(100) meets the relation of It(111)Ia(101)/Ia(100)≥1.5, in an X-ray diffraction angle 2θ range of 36° to 39°.

3. The hard coating according to claim 1, wherein a ratio of a merged X-ray diffraction peak value It(111)Ia(101) of the (111) planes of said lower layer and the (101) planes of said upper layer to the X-ray diffraction peak value It(200) of the (200) planes of said lower layer meets the relation of It(111)Ia(101)/It(200)≥1.5, in an X-ray diffraction angle 2θ range of 36-39°.

4. The hard coating according to claim 1, wherein 30% or more of lattice fringes are continuous in an interface between said lower layer and said upper layer.

5. A hard-coated tool having the hard coating recited in claim 1 formed on a substrate.

6. A method for producing the hard coating recited in claim 1 by a chemical vapor deposition method, comprising
(1) using a mixture gas $A_1$ comprising a $TiCl_4$ gas, an $AlCl_3$ gas, an $N_2$ gas and an $H_2$ gas, and a mixture gas $B_1$ comprising an $N_2$ gas, an $NH_3$ gas and an $H_2$ gas, as a first starting material gas for forming said lower layer; and
(2) using a mixture gas $A_2$ comprising an $AlCl_3$ gas, an $N_2$ gas and an $H_2$ gas, and a mixture gas $B_2$ comprising an $NH_3$ gas, an $N_2$ gas and an $H_2$ gas, as a second starting material gas for forming said upper layer, wherein said lower layer is formed at a forming pressure of 3-6 kPa and a forming temperature of 750-830° C.; and said upper layer is formed at a forming pressure of 3-5 kPa and a forming temperature of 750-850° C.

7. The method for producing a hard coating according to claim 6, wherein
said first starting material gas is composed of a mixture gas $A_1$ having a composition comprising 0.02-0.31% by volume of $TiCl_4$ gas, 0.15-0.8% by volume of an $AlCl_3$ gas, and 3-40% by volume of an $N_2$ gas, the balance being an $H_2$ gas, and a mixture gas $B_1$ having a composition comprising 0.4-1.9% by volume of an $NH_3$ gas, and 2-26% by volume of an $N_2$ gas, the balance being an $H_2$ gas, with the total amount of the $TiCl_4$ gas, the $AlCl_3$ gas, the $NH_3$ gas, the $N_2$ gas, and the $H_2$ gas as 100% by volume, a volume ratio $H_2(A_1)/H_2(B_1)$ of an $H_2$ gas in said mixture gas $A_1$ to an $H_2$ gas in said mixture gas $B_1$ being 1-5; and
said second starting material gas is composed of a mixture gas $A_2$ having a composition comprising 0.5-1.4% by volume of an $AlCl_3$ gas, and 10.6-30.6% by volume of an $N_2$ gas, the balance being an $H_2$ gas, and a mixture gas $B_2$ having a composition comprising 0.6-0.95% by volume of an $NH_3$ gas, and 10.6-30.6% by volume of an $N_2$ gas, the balance being an $H_2$ gas, with the total amount of the $AlCl_3$ gas, the $NH_3$ gas, the $N_2$ gas and the $H_2$ gas as 100% by volume, a volume ratio $H_2(A_2)/H_2(B_2)$ of an $H_2$ gas in said mixture gas $A_2$ to an $H_2$ gas in said mixture gas $B_2$ being 0.3-3.

8. The method for producing a hard coating according to claim 6, wherein
a chemical vapor deposition apparatus comprising first and second pipes rotating around a rotation axis O is used;
said first pipe has first nozzles;
said second pipe has second nozzles;
the distance $H_1$ between the openings of said first nozzles and said rotation axis O is larger than the distance $H_2$ between the openings of said second nozzles and said rotation axis O; and
(a) said mixture gases $A_1$, $A_2$ are successively ejected from said first nozzles, and said mixture gases $B_1$, $B_2$ are successively ejected from said second nozzles, or
(b) said mixture gases $B_1$, $B_2$ are successively ejected from said first nozzles, and said mixture gases $A_1$, $A_2$ are successively ejected from said second nozzles.

9. The method for producing a hard coating according to claim 8, wherein a ratio ($H_1/H_2$) of said distance $H_1$ to said distance $H_2$ is in a range of 1.5-3.

10. The method for producing a hard coating according to claim 6, wherein said lower layer is formed at a forming pressure of 3-6 kPa and a forming temperature of 750-900° C.; and said upper layer is formed at a forming pressure of 3-5 kPa and a forming temperature of 750-850° C.

11. A method for producing the hard-coated tool recited in claim 5, wherein
(1) a first starting material gas composed of a mixture gas $A_1$ comprising a $TiCl_4$ gas, an $AlCl_3$ gas, an $N_2$ gas and an $H_2$ gas, and a mixture gas $B_1$ comprising an $N_2$ gas, an $NH_3$ gas and an $H_2$ gas is introduced into a chemical vapor deposition apparatus containing substrates, to form said lower layer; and then (2) a second starting material gas composed of a mixture gas $A_2$ comprising an $AlCl_3$ gas, an $N_2$ gas and an $H_2$ gas, and a mixture gas $B_2$ comprising an $NH_3$ gas, an $N_2$ gas and an $H_2$ gas is introduced into a chemical vapor deposition apparatus containing substrates, to form said upper layer, wherein said lower layer is formed at a forming pressure of 3-6 kPa and a forming temperature of 750-830° C.; and said upper layer is formed at a forming pressure of 3-5 kPa and a forming temperature of 750-850° C.

12. The method for producing a hard-coated tool according to claim 11, wherein
said first starting material gas is composed of a mixture gas $A_1$ having a composition comprising 0.02-0.31% by volume of a $TiCl_4$ gas, 0.15-0.8% by volume of an $AlCl_3$ gas, and 3-40% by volume of an $N_2$ gas, the balance being an $H_2$ gas, and a mixture gas $B_1$ having a composition comprising 0.4-1.9% by volume of an $NH_3$ gas, and 2-26% by volume of an $N_2$ gas, the balance being an $H_2$ gas, with the total amount of the $TiCl_4$ gas, the $AlCl_3$ gas, the $NH_3$ gas, the $N_2$ gas, and the $H_2$ gas as 100% by volume, a volume ratio $H_2$ $(A_1)/H_2$ $(B_1)$ of an $H_2$ gas in said mixture gas $A_1$ to an $H_2$ gas in said mixture gas $B_1$ being 1-5; and
said second starting material gas is composed of a mixture gas $A_2$ having a composition comprising 0.5-1.4% by volume of an $AlCl_3$ gas, and 10.6-30.6% by volume of an $N_2$ gas, the balance being an $H_2$ gas, and a mixture gas $B_2$ having a composition comprising 0.6-0.95% by volume of an $NH_3$ gas, and 10.6-30.6% by volume of an $N_2$ gas, the balance being an $H_2$ gas, with the total amount of the $AlCl_3$ gas, the $NH_3$ gas, the $N_2$ gas and the $H_2$ gas as 100% by volume, a volume ratio $H_2$ $(A_2)/H_2$ $(B_2)$ of an $H_2$ gas in said mixture gas $A_2$ to an $H_2$ gas in said mixture gas $B_2$ being 0.3-3.

13. The method for producing a hard-coated tool according to claim 11, wherein
a chemical vapor deposition apparatus comprising first and second pipes rotating around a rotation axis O is used;
said first pipe comprises first nozzles;
said second pipe comprises second nozzles;
the distance $H_1$ between the openings of said first nozzles and said rotation axis O is larger than the distance $H_2$ between the openings of said second nozzles and said rotation axis O; and
(a) said mixture gases $A_1$, $A_2$ are successively ejected from said first nozzles, and said mixture gases $B_1$, $B_2$ are successively ejected from said second nozzles, or
(b) said mixture gases $B_1$, $B_2$ are successively ejected from said first nozzles, and said mixture gases $A_1$, $A_2$ are successively ejected from said second nozzles.

14. The method for producing a hard-coated tool according to claim 13, wherein a ratio $(H_1/H_2)$ of said distance $H_1$ to said distance $H_2$ is in a range of 1.5-3.

* * * * *